(12) United States Patent
Prasad et al.

(10) Patent No.: US 12,195,314 B2
(45) Date of Patent: Jan. 14, 2025

(54) CATHODE EXCHANGE MECHANISM TO IMPROVE PREVENTATIVE MAINTENANCE TIME FOR CLUSTER SYSTEM

(71) Applicant: Applied Materials, Inc., Santa Clara, CA (US)

(72) Inventors: Bhaskar Prasad, Jamshedpur (IN); Kirankumar Neelasandra Savandaiah, Bangalore (IN); Thomas Brezoczky, Los Gatos, CA (US); Srinivasa Rao Yedla, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 1019 days.

(21) Appl. No.: 17/165,427

(22) Filed: Feb. 2, 2021

(65) Prior Publication Data

US 2022/0242706 A1    Aug. 4, 2022

(51) Int. Cl.
| | | |
|---|---|---|
| B66F 3/36 | (2006.01) | |
| B66F 3/24 | (2006.01) | |
| B66F 13/00 | (2006.01) | |
| H01J 37/02 | (2006.01) | |

(52) U.S. Cl.
CPC .............. *B66F 3/36* (2013.01); *B66F 3/247* (2013.01); *B66F 13/00* (2013.01); *H01J 37/023* (2013.01)

(58) Field of Classification Search
CPC ......... B66C 17/04; B66C 17/06; B66F 3/247; B66F 3/36; B66F 13/00; H01J 37/023
See application file for complete search history.

(56) References Cited

U.S. PATENT DOCUMENTS

| | | | |
|---|---|---|---|
| 5,863,170 A | 1/1999 | Boitnott et al. | |
| 5,879,459 A | 3/1999 | Gadgil et al. | |
| 6,162,299 A | 12/2000 | Raaijmakers | |
| 6,440,261 B1 | 8/2002 | Tepman et al. | |
| 6,447,607 B2 | 9/2002 | Soininen et al. | |
| 6,576,062 B2 | 6/2003 | Matsuse | |
| 6,593,718 B1 * | 7/2003 | Yamazoe | B25J 9/042 318/568.11 |
| 6,604,853 B2 | 8/2003 | Chao et al. | |
| 6,635,115 B1 | 10/2003 | Fairbairn et al. | |

(Continued)

FOREIGN PATENT DOCUMENTS

| | | |
|---|---|---|
| CN | 100411095 C | 8/2008 |
| CN | 102965643 B | 2/2016 |

(Continued)

OTHER PUBLICATIONS

International Search Report and Written Opinion dated Sep. 4, 2020 for Application No. PCT/US2020/033456.

*Primary Examiner* — Seahee Hong
(74) *Attorney, Agent, or Firm* — Patterson + Sheridan, LLP

(57) ABSTRACT

A method and apparatus for lifting a process station from a processing module is described herein. The apparatus includes a lift assembly disposed on the processing module, a lift cage, and one or more guide pins. The lift assembly is disposed to be capable of reaching each of the process stations disposed within the processing module. The lift assembly is used for replacement and maintenance of the process stations and further enables the automated removal and placement of the process stations within the processing module. Maintenance methods enabled by the lift assembly are additionally disclosed herein.

20 Claims, 17 Drawing Sheets

(56) References Cited

U.S. PATENT DOCUMENTS

| | | |
|---|---|---|
| 6,852,194 B2 | 2/2005 | Matsushita et al. |
| 6,962,471 B2 | 11/2005 | Birkner et al. |
| 7,066,703 B2 | 6/2006 | Johnson |
| 7,090,741 B2 | 8/2006 | Narushima et al. |
| D527,751 S | 9/2006 | Kondoh et al. |
| 7,138,336 B2 | 11/2006 | Lee et al. |
| 7,169,234 B2 | 1/2007 | Weeks et al. |
| 7,189,432 B2 | 3/2007 | Chiang et al. |
| 7,258,768 B2 | 8/2007 | Yamazaki |
| 7,318,869 B2 | 1/2008 | Chiang et al. |
| 7,422,406 B2 | 9/2008 | van der Meulen |
| 7,458,763 B2 | 12/2008 | van der Meulen |
| 7,537,662 B2 | 5/2009 | Soininen et al. |
| 7,784,164 B2 | 8/2010 | White et al. |
| 7,799,179 B2 | 9/2010 | Maass et al. |
| 7,806,983 B2 | 10/2010 | Chiang et al. |
| 7,833,352 B2 | 11/2010 | Bondestam et al. |
| 7,905,991 B2 | 3/2011 | Esselbach et al. |
| 7,959,403 B2 | 6/2011 | van der Meulen |
| 7,988,399 B2 | 8/2011 | van der Meulen |
| 8,029,226 B2 | 10/2011 | van der Meulen |
| 8,033,772 B2 | 10/2011 | Kurita et al. |
| 8,088,678 B2 | 1/2012 | Kitano et al. |
| 8,197,177 B2 | 6/2012 | van der Meulen et al. |
| 8,216,380 B2 | 7/2012 | White et al. |
| 8,267,632 B2 | 9/2012 | van der Meulen et al. |
| 8,292,563 B2 | 10/2012 | Haris |
| 8,313,277 B2 | 11/2012 | van der Meulen et al. |
| 8,354,656 B2 | 1/2013 | Beloussov et al. |
| 8,403,613 B2 | 3/2013 | van der Meulen |
| 8,434,989 B2 | 5/2013 | van der Meulen |
| 8,439,623 B2 | 5/2013 | van der Meulen |
| 8,500,388 B2 | 8/2013 | van der Meulen et al. |
| 8,523,507 B2 | 9/2013 | van der Meulen |
| 8,558,299 B2 | 10/2013 | Cao et al. |
| 8,574,409 B2 | 11/2013 | Kadlec et al. |
| 8,602,716 B2 | 12/2013 | van der Meulen et al. |
| 8,672,605 B2 | 3/2014 | van der Meulen et al. |
| 8,696,298 B2 | 4/2014 | van der Meulen et al. |
| 8,728,239 B2 | 5/2014 | Bauer et al. |
| 8,807,905 B2 | 8/2014 | Meulen |
| 8,812,150 B2 | 8/2014 | van der Meulen et al. |
| 8,870,513 B2 | 10/2014 | Voser et al. |
| 8,870,514 B2 | 10/2014 | van der Meulen et al. |
| 8,895,450 B2 | 11/2014 | Cao et al. |
| 8,944,738 B2 | 2/2015 | van der Meulen |
| 8,945,308 B2 | 2/2015 | Schaller |
| 9,005,539 B2 | 4/2015 | Halpin et al. |
| 9,085,825 B2 | 7/2015 | Kim |
| 9,103,030 B2 | 8/2015 | Kato et al. |
| 9,214,589 B2 | 12/2015 | Voser et al. |
| 9,252,037 B2 | 2/2016 | Scholte Von Mast et al. |
| 9,281,222 B2 | 3/2016 | Weaver et al. |
| 9,336,997 B2 | 5/2016 | Bera |
| 9,340,874 B2 | 5/2016 | Halpin et al. |
| 9,347,131 B2 | 5/2016 | Maass et al. |
| 9,355,824 B2 | 5/2016 | Kadlec et al. |
| 9,378,994 B2 | 6/2016 | Weaver et al. |
| 9,396,981 B2 | 7/2016 | Scholte Von Mast et al. |
| 9,443,749 B2 | 9/2016 | Wakabayashi et al. |
| 9,478,420 B2 | 10/2016 | Castaldi et al. |
| 9,490,149 B2 | 11/2016 | Chandrasekharan et al. |
| 9,551,068 B2 | 1/2017 | Kumagai et al. |
| 9,583,349 B2 | 2/2017 | Gandikota et al. |
| 9,587,306 B2 | 3/2017 | Rohrmann et al. |
| 9,644,261 B2 | 5/2017 | Weichart et al. |
| 9,698,009 B2 | 7/2017 | Sato et al. |
| 9,831,094 B2 | 11/2017 | Rahtu et al. |
| 9,842,755 B2 | 12/2017 | Ocker et al. |
| 9,884,726 B2 | 2/2018 | van der Meulen et al. |
| 9,890,473 B2 | 2/2018 | Newman |
| 9,929,008 B2 | 3/2018 | Wamura et al. |
| 9,932,674 B2 | 4/2018 | Kato et al. |
| 9,953,843 B2 | 4/2018 | Shen et al. |
| 9,960,072 B2 | 5/2018 | Coomer |
| 10,043,693 B1 | 8/2018 | Kim et al. |
| 10,086,511 B2 | 10/2018 | van der Meulen |
| 10,138,553 B2 | 11/2018 | Scholte Von Mast et al. |
| 10,145,014 B2 | 12/2018 | Nozawa et al. |
| 10,202,682 B2 | 2/2019 | Rieschl et al. |
| 10,202,687 B2 | 2/2019 | Miura et al. |
| 10,221,480 B2 | 3/2019 | Kato et al. |
| 10,256,125 B2 | 4/2019 | Weaver et al. |
| 10,262,888 B2 | 4/2019 | Gangakhedkar et al. |
| 10,347,515 B2 | 7/2019 | Heinz |
| 10,388,559 B2 | 8/2019 | Rieschl et al. |
| 10,427,303 B2 | 10/2019 | Weaver et al. |
| 10,586,720 B2 | 3/2020 | Weaver et al. |
| 10,665,436 B2 | 5/2020 | Uemura et al. |
| 2002/0051698 A1 | 5/2002 | Birkner et al. |
| 2002/0170671 A1 | 11/2002 | Matsushita et al. |
| 2003/0109094 A1 | 6/2003 | Seidel et al. |
| 2004/0159553 A1 | 8/2004 | Nogami et al. |
| 2004/0261710 A1 | 12/2004 | Matsushita et al. |
| 2005/0005850 A1 | 1/2005 | Yamazaki |
| 2005/0006230 A1 | 1/2005 | Narushima et al. |
| 2005/0111936 A1 | 5/2005 | Kim et al. |
| 2005/0115822 A1 | 6/2005 | Maass et al. |
| 2005/0118009 A1 | 6/2005 | van der Meulen |
| 2006/0051507 A1 | 3/2006 | Kurita et al. |
| 2006/0056952 A1 | 3/2006 | Haris |
| 2006/0101728 A1 | 5/2006 | White et al. |
| 2006/0137608 A1 | 6/2006 | Choi et al. |
| 2006/0137609 A1 | 6/2006 | Puchacz et al. |
| 2006/0157340 A1 | 7/2006 | Kurita et al. |
| 2006/0201074 A1 | 9/2006 | Kurita et al. |
| 2006/0263177 A1 | 11/2006 | Meulen |
| 2007/0020890 A1 | 1/2007 | Thakur et al. |
| 2007/0082588 A1* | 4/2007 | de Vries ............ H01L 21/67161 |
| | | 451/67 |
| 2007/0215036 A1 | 9/2007 | Park et al. |
| 2007/0281090 A1 | 12/2007 | Kurita et al. |
| 2008/0014055 A1 | 1/2008 | van der Meulen |
| 2008/0072821 A1 | 3/2008 | Dalton et al. |
| 2008/0124194 A1 | 5/2008 | van der Meulen et al. |
| 2008/0124197 A1 | 5/2008 | van der Meulen et al. |
| 2008/0138176 A1 | 6/2008 | Kim et al. |
| 2008/0187417 A1 | 8/2008 | van der Meulen et al. |
| 2008/0219808 A1 | 9/2008 | van der Meulen et al. |
| 2008/0219812 A1 | 9/2008 | van der Meulen et al. |
| 2008/0226429 A1 | 9/2008 | van der Meulen |
| 2008/0232947 A1 | 9/2008 | van der Meulen et al. |
| 2009/0087286 A1 | 4/2009 | Meulen |
| 2009/0173622 A1 | 7/2009 | Weichart et al. |
| 2009/0180847 A1 | 7/2009 | Guo et al. |
| 2010/0012036 A1 | 1/2010 | Silva et al. |
| 2010/0075453 A1 | 3/2010 | Kurita et al. |
| 2010/0120238 A1 | 5/2010 | Kitano et al. |
| 2010/0178135 A1* | 7/2010 | Laceky ............ H01L 21/68707 |
| | | 414/217 |
| 2010/0281683 A1 | 11/2010 | White et al. |
| 2010/0304027 A1 | 12/2010 | Lee et al. |
| 2010/0327187 A1 | 12/2010 | Beloussov et al. |
| 2012/0027542 A1 | 2/2012 | Isomura et al. |
| 2012/0031749 A1 | 2/2012 | Dubs et al. |
| 2012/0328797 A1 | 12/2012 | Maass et al. |
| 2013/0302115 A1 | 11/2013 | Wakabayashi et al. |
| 2014/0262035 A1 | 9/2014 | Merry et al. |
| 2014/0349011 A1 | 11/2014 | Weichart |
| 2015/0063957 A1 | 3/2015 | Olgado |
| 2015/0214014 A1 | 7/2015 | Sato et al. |
| 2015/0240360 A1 | 8/2015 | Leeser |
| 2016/0108515 A1 | 4/2016 | Elghazzali et al. |
| 2016/0138159 A1 | 5/2016 | Kato et al. |
| 2017/0175247 A1 | 6/2017 | Weichart |
| 2017/0218514 A1 | 8/2017 | Kato et al. |
| 2018/0142350 A1 | 5/2018 | Fukiage et al. |
| 2018/0195173 A1 | 7/2018 | Kato et al. |
| 2018/0245212 A1 | 8/2018 | Schwyn-Thony et al. |
| 2018/0245218 A1 | 8/2018 | Kato |
| 2018/0261473 A1 | 9/2018 | Weichart et al. |
| 2018/0334745 A1 | 11/2018 | Kato |
| 2019/0013225 A1 | 1/2019 | Taguchi et al. |

(56) References Cited

U.S. PATENT DOCUMENTS

| | | |
|---|---|---|
| 2019/0096715 A1 | 3/2019 | Lodder et al. |
| 2019/0252160 A1 | 8/2019 | Balon et al. |
| 2019/0252166 A1 | 8/2019 | Felzer et al. |

FOREIGN PATENT DOCUMENTS

| | | |
|---|---|---|
| CN | 105200393 B | 10/2018 |
| DE | 10350517 A1 | 6/2005 |
| DE | 102012103295 A1 | 7/2013 |
| DE | 102013111790 A1 | 4/2015 |
| DE | 102013113052 A1 | 5/2015 |
| EP | 2102889 A2 | 9/2009 |
| JP | 5088284 B2 | 12/2012 |
| JP | 5315898 B2 | 10/2013 |
| JP | 5544697 B2 | 7/2014 |
| JP | 5870568 B2 | 3/2016 |
| JP | 6330623 B2 | 5/2018 |
| JP | 6464765 B2 | 2/2019 |
| JP | 6478847 B2 | 3/2019 |
| JP | 2019036630 A | 3/2019 |
| KR | 100854803 B1 | 8/2008 |
| KR | 101887072 B1 | 8/2018 |
| WO | 0137317 A1 | 5/2001 |
| WO | 2017212077 A2 | 12/2017 |
| WO | 2018197305 A2 | 11/2018 |
| WO | 2019020391 A1 | 1/2019 |
| WO | 2019020393 A1 | 1/2019 |
| WO | 2019096515 A1 | 5/2019 |
| WO | 2019096564 A1 | 5/2019 |
| WO | 2019105671 A1 | 6/2019 |

\* cited by examiner

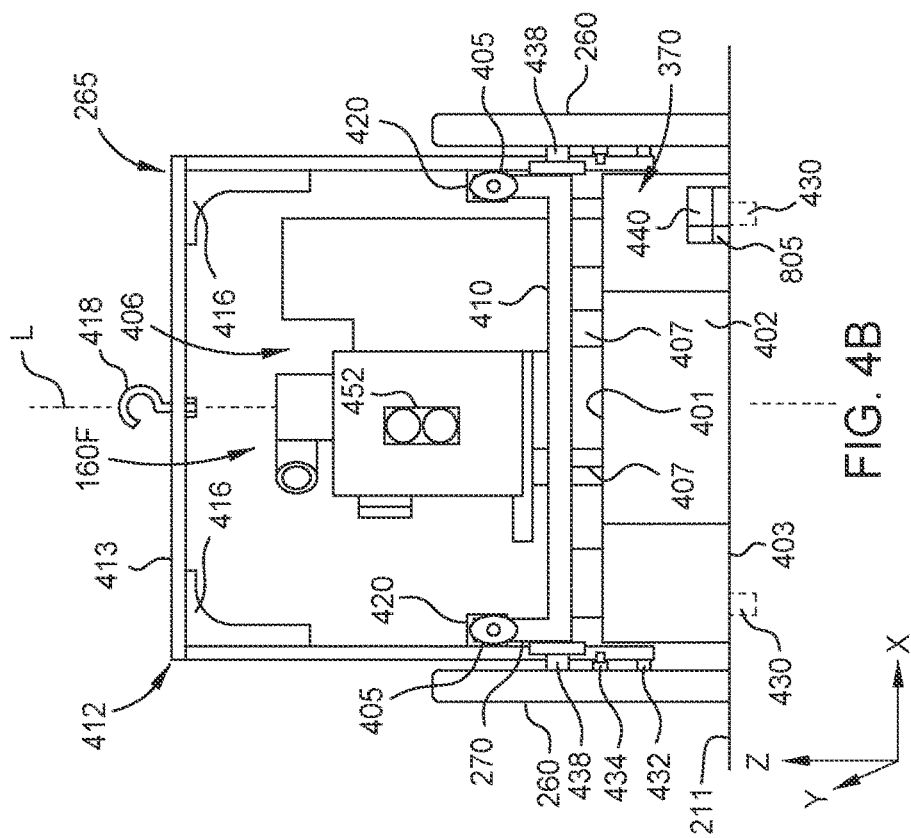
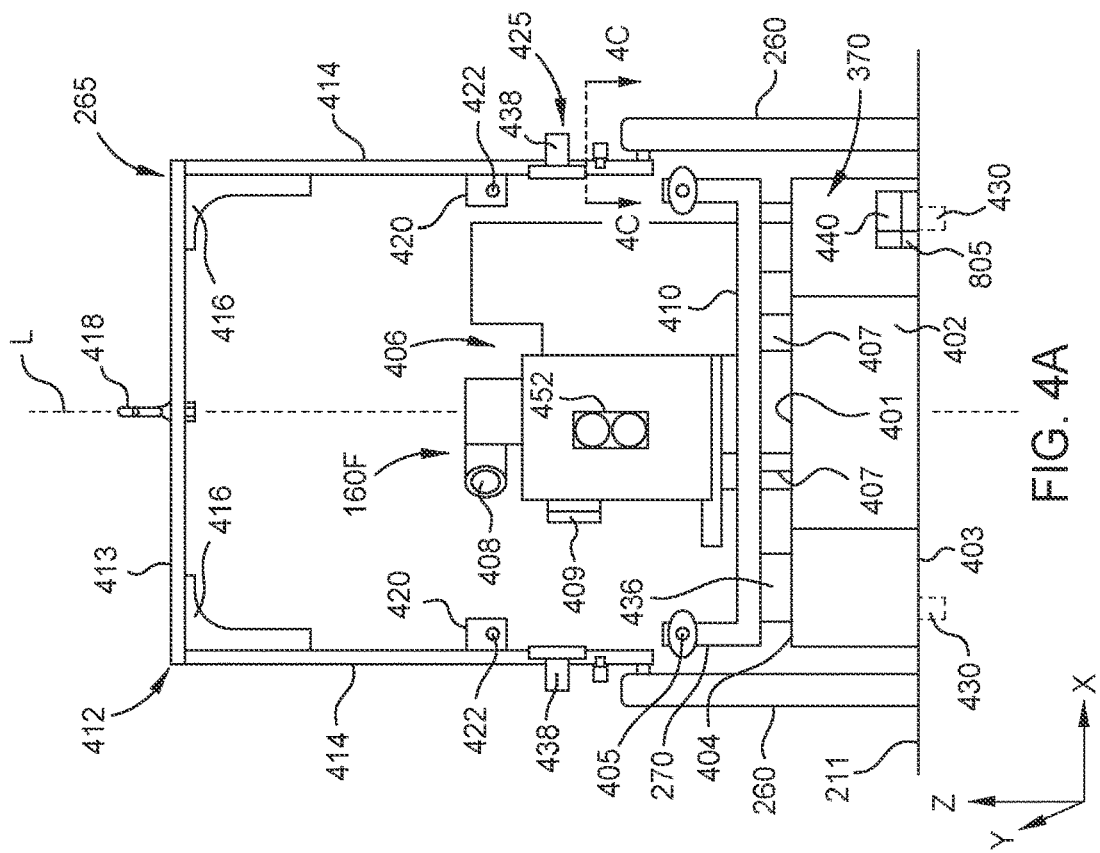

CATHODE EXCHANGE MECHANISM TO IMPROVE PREVENTATIVE MAINTENANCE TIME FOR CLUSTER SYSTEM

BACKGROUND

Field

The present disclosure relates to an apparatus and method of performing preventative maintenance on a substrate processing system. More particularly, the present disclosure relates to the use of a lift structure and supporting apparatus to remove a processing station from a processing module.

Description of the Related Art

Deposition and dry etch processes are used to form layers on, and remove all or a portion of one or more layers from, a substrate. For example, it is known to deposit thin metal and dielectric films on substrates, such as directly on a semiconductor substrate or on film layers already formed thereon, using a sputtering process, also known as physical vapor deposition or "PVD". In PVD, a vacuum chamber holds a target and a substrate support having a substrate thereon, and the target, composed of a metal or a dielectric, is negatively charged and exposed to an inert gas plasma to cause plasma formed gas ions to bombard the target and sputter material therefrom such that at least a portion of that material is deposited on the substrate. In the fabrication of semiconductor devices such as integrated circuits, PVD is commonly used to deposit materials, such as metal films, metal oxides and metal nitrides on a semiconductor substrate, or on film layers previously formed thereon. The deposited materials can then be further processed into metallic studs known as contacts or vias, or into lines used to interconnect active regions on or in the underlying semiconductor substrate. For the deposition of metal oxides and metal nitrides, an oxygen or nitrogen gas is added to the inert plasma gas, and the N or O atoms therein react with the sputtered metal to result in the metal oxide or metal nitride film being deposited on the substrate or a film layer thereon. PVD is also used to deposit layers, including non-metallic layers, which are used to define features in underlying film layers. For example, the PVD process is used to deposit patterning films, which are then patterned using a photoresist application and developing process, photolithography, and etching, to allow etching of an underlying film using an etchant to remove material exposed in openings in the patterning layer, as well as to deposit anti-reflective coatings, materials used to form hard masks and other useful materials.

Another method of forming a thin film on a substrate is commonly referred to as chemical vapor deposition, or "CVD". In a CVD process, a substrate is loaded into a vacuum chamber, and one or more chemical precursors having the components of a thin film to be formed on the substrate are introduced into the vacuum chamber. Deposition of the thin film on the substrate, or on a layer thereon, occurs by one or more of a thermal reaction where the temperature of the substrate is sufficient to cause the precursor to decompose and leave behind one or more atoms of the thin film material to be deposited, by reaction of the chemical precursors with each other, at the substrate surface, over the substrate surface, or both, to form and leave on the substrate surface an atom or molecule of the thin film material to be deposited as a result of the reaction. To speed the reaction, or even initiate the reaction, a plasma or electromagnetic energy may be used to cause the material to be to be deposited on the substrate to be formed by reaction with the substrate surface, on the surface of a film layer thereon, over the substrate, or combinations thereof.

Dry etching, commonly used in semiconductor processing to form features in a substrate, or in one or more thin films on the substrate is typically a reactive ion etch process. Here, a plasma composed of an inert gas and one or more etching gases is formed in a vacuum chamber, and the material underlying a patterned mask layer is exposed to etching reactants in the plasma, while the substrate or substrate support is negatively biased to also cause ions in the plasma to physically remove material of the underlying layer exposed through the openings in the mask layer. Etching radicals are simultaneously created from the etching gas in the plasma to chemically interact with and chemically etch the material of the underlying layer exposed through the openings in the mask layer.

Many thin film deposition and etch processes used in semiconductor and flat panel display production employ single substrate processing chambers that are attached to a mainframe of a cluster tool, wherein a single substrate is loaded into a dedicated vacuum process chamber having dedicated hardware therein to support the substrate during a process performed thereon. Maintenance of single substrate processing chambers is performed periodically throughout the life of the processing chamber to ensure high quality and consistent throughputs. However, current apparatus and methods for removal of the processing chambers from the cluster tool and providing maintenance are time consuming and require significant downtime of the cluster tool.

While the conventional cluster tool designs and maintenance systems are suitable for processing substrates and performing periodic maintenance of processing chambers within the cluster tool, the inventors have found that current maintenance systems and maintenance methods are limited in reliability, have a relatively large footprint, are expensive to maintain, and require significant downtime during maintenance.

Therefore, there is a need for a system and a method of providing maintenance to a processing module that solves the problems described above.

SUMMARY

The present disclosure generally relates to apparatus and method for removing and replacing a process module. In one embodiment, a lift assembly is disclosed. The lift assembly includes two or more support legs configured to be coupled to a processing module of a substrate processing system. A support bar extends between the two or more support legs and includes opposing ends that are each coupled to one of the two or more support legs. A first actuator is coupled to the support bar and a first end of a first arm. The first actuator has a first actuator rotational axis and is configured to rotate the first arm about the first actuator rotational axis. A second actuator is coupled to a second end of the first arm and a first end of a second arm. The second actuator has a second actuator rotational axis and is configured to rotate the second arm about the second actuator rotational axis. A lift actuator is coupled to a second end of the second arm. A lift clasp coupled to the lift actuator.

In another embodiment, a substrate processing system is described. The substrate processing system includes a processing module defining a transfer region. A plurality of processing stations are coupled to the processing module and disposed in an array around a central portion of the processing module. A lift assembly is disposed on the processing module and between the plurality of processing stations. The lift assembly includes two or more support legs coupled to the processing module and a support bar extending between the two or more support legs. The support bar includes opposing ends that are each coupled to the two or more support legs. The lift assembly further includes a first actuator coupled to the support bar and a first end of a first arm. The first actuator has a first actuator rotational axis and is configured to rotate the first arm about the first actuator rotational axis. A lift actuator is coupled to a second end of the second arm. A lift clasp is coupled to the lift actuator.

In yet another embodiments, a method of transferring a processing station for maintenance is described. The method includes coupling a lift cage to a first processing station of a plurality of processing stations disposed on a processing module. The first processing station is in a first position and includes a source assembly. An arm assembly of a lift assembly is positioned over the processing station, the lift assembly being disposed on top of the processing module between a plurality of the processing stations. A lift clasp of the arm assembly is coupled to a cage clasp of the lift cage. A portion of the first processing station is removed from a position on the processing module. The portion of the first processing station is positioned in a second position different from the first position.

In yet another embodiment, a fluid transfer column is described. The fluid transfer column includes a fluid delivery pipe, a fluid inlet disposed on a first end of the fluid delivery pipe and configured to be coupled to a fluid feed source, and a fluid outlet disposed on a second end of the fluid delivery pipe. An actuator is coupled to the fluid delivery pipe and configured to actuate the fluid delivery pipe. A mounting column is disposed around a portion of the fluid delivery pipe.

In yet another embodiment, a substrate processing system is described. The substrate processing system includes a processing station. The processing station includes a source assembly and a fluid return column. The fluid return column includes a fluid inlet disposed on a first end of the fluid return column and a fluid outlet disposed on a second end of the fluid return column. A mounting column is disposed around a portion of the fluid return column and coupled to the source assembly. An actuator is coupled to the fluid return column and configured to position the fluid return column relative to the mounting column.

In yet another embodiments, a method of assembling a lift assembly is described. The method includes attaching a leg extension member to an upper end of each of two support legs. A support bar is actuated upwards between the two support legs and at least partially above upper end of each of the two support legs, the support bar having arm assembly disposed thereon. The support bar is secured in a raised position using two first brackets. The two first brackets couple to an inner surface of each of the two support legs and a bottom surface of the support bar. The leg extension members are removed from the two support legs.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIGS. 4A and 4B are schematic side views of a process station with a lift cage disposed thereon, according to one or more embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments provided in this application are related to substrate processing systems used in semiconductor device manufacturing, and more particularly, to systems and methods for performing preventative maintenance or other forms of maintenance on one or more processing modules within a cluster tool. Preventative maintenance activities as described herein will generally include the use of a processing station lift system and/or other supporting hardware. The processing station lift system is disposed on or over a central portion of a processing module and between a plurality of processing stations. Each of the processing stations are configured to perform one or more processing operations on semiconductor substrates passing therethrough. The one or more processing operations include a PVD, a CVD, an ALD, or a dry etching process.

The processing station lift system includes a lift assembly disposed between the processing stations, a lift cage coupled to one or more of the processing stations, and a plurality of guide pins disposed adjacent to each of the processing stations. The lift assembly is configured to attach to a portion of the lift cage and lift the processing station from the processing module before moving the processing station to a secondary location, such as a maintenance table, for maintenance. The processing station lift system described herein may be automated. Automating the processing station lift system includes the automated detachment of one or more water lines, one or more gas lines, and one or more electrical connections. In some embodiments, each of the one or more water lines, the one or more gas lines, and the one or more electrical connections are disposed at a station attachment point, which can be coupled and uncoupled from a module attachment point.

The use of the processing station lift system and the station attachment point allows for simplified maintenance operations and reduced maintenance down-times. The separation of the processing station from a liner and a substrate lift assembly, such as the support chuck assembly 392, within the processing module further enables the processing station opening in which the processing station is disposed to be sealed from the other components of the processing module, such as a transfer region. The sealing of the processing station from the other components and other processing stations allows for the continued use of the other processing stations within the processing module as preventative maintenance is performed on one of the plurality of processing stations.

Some of the embodiments disclosed herein generally relate to a processing station lift assembly and methods enabled based on the use thereof. The processing station lift assembly beneficially enables a smaller overall tool footprint and faster maintenance operations on processing stations, which reduces tool downtime and cost of ownership of the substrate processing system.

Figure 1:
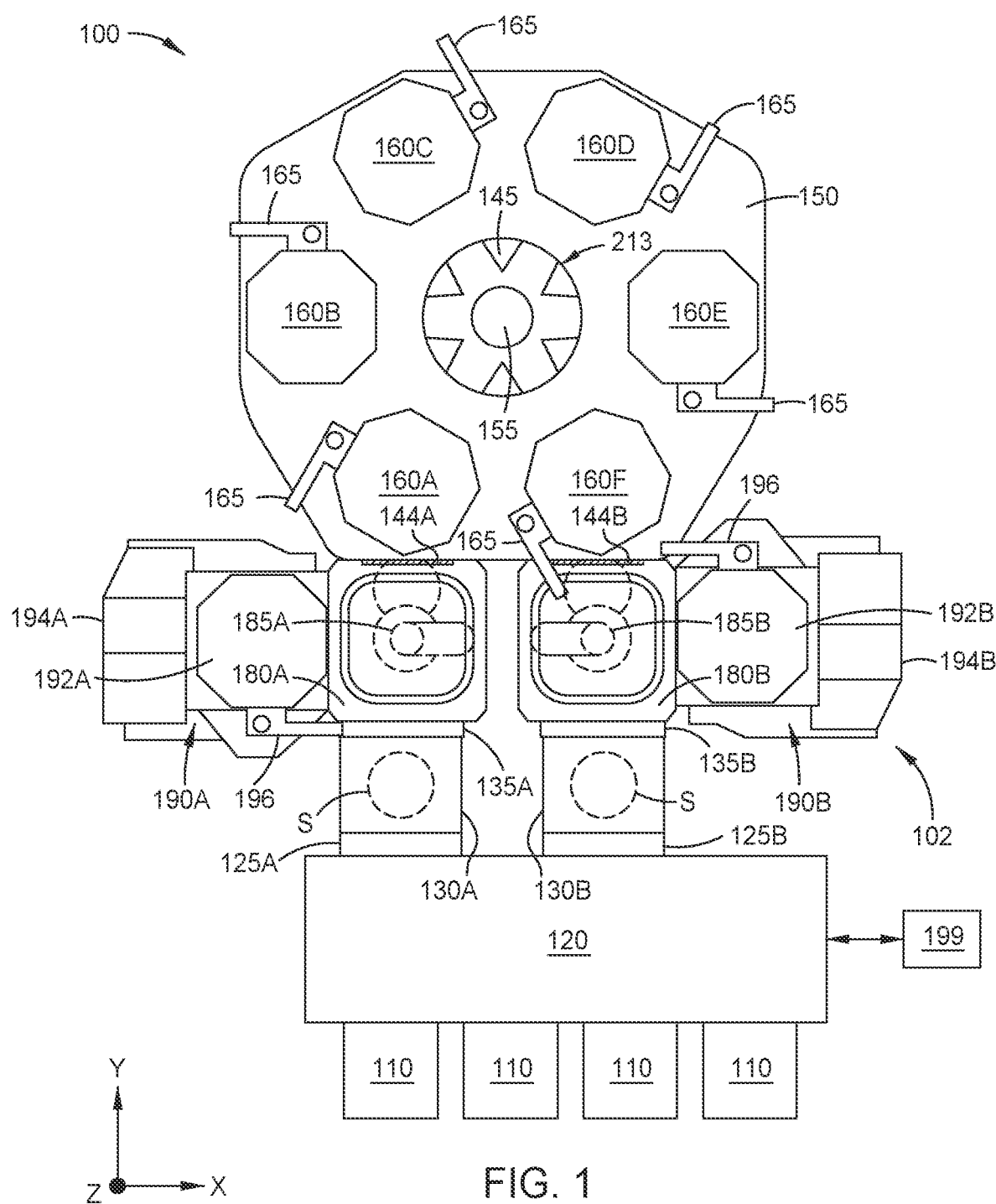
FIG. 1 is a plan view of a processing system that includes processing module that includes process stations therein for processing substrates, according to one or more embodiments.

FIG. 1 is a plan view of a processing system 100 that includes processing module 150 that includes process stations 160A-160F therein for processing substrates, according to one or more embodiments. As shown in FIG. 1, the processing system 100 includes six process stations 160A-160F, which are accessible within the substrate processing module 15. A substrate may be sequentially moved along the circumference of an imaginary circle which intersects a central location of each of the process stations 160, such that a plurality of a processes are performed on the substrates. Each process station 160A-160F can be independently or similarly configured to enable a deposition process, for example a PVD, CVD, ALD (atomic layer deposition) or other type of deposition process, or an etching process. Each process station 160A-160F further is connected to a vacuum pump 165, for example a roughing pump, the output of which is connected to an exhaust duct (not shown), to reduce the pressure within the process stations 160A-160F to a sub-atmospheric pressure on the order of about $10^{-3}$ Torr.

Each process station 160a-160F is disposed around a central opening 213 and are positioned in a circular array around a central portion of the processing module 150. The central opening 213 is disposed through the middle of the processing module 150. The central opening 213 includes a transfer device 155 disposed therein. The transfer device 155 is configured to transfer a substrate between any one of the process stations 160A-160F within the processing module 150. The central opening 213 includes a transfer volume 145. The transfer device 155 is disposed within the transfer volume 145. The transfer volume 145 is the volume through which the substrates are transferred and includes an area directly below each of the process stations 160A-160F.

The processing system 100 further includes an intermediary section 102, which is coupled between the processing module 150 and a front end 120, and a system controller 199. As shown in FIG. 1, the intermediary section 102 includes a pair of loadlock chambers 130A, 130B and a pair of intermediate robot chambers 180A, 180B. Each of the loadlock chambers 130A, 130B is separately connected through a respective first valve 125A, 125B, at one side thereof to the front end 120, and through a respective second valve 135A, 135B, to one of the intermediate robot chambers 180A, 180B, respectively. During operation a front end robot (not shown) in the front end 120 moves a substrate therefrom into a loadlock chamber 130A or 130B, or removes a substrate from a loadlock chamber 130A, 130B. Then an intermediate robot 185A, 185B in one of the associated intermediate robot chambers 180A, 180B connected to an associated one of the loadlock chambers 130A, 130B moves a substrate from the loadlock chamber 130A or loadlock chamber 130B and into the corresponding intermediate robot chamber 180A, 180B. In one aspect, the intermediary section 102 also includes a preclean/degas chamber 192 connected to an intermediate robot chamber 180, for example a preclean/degas chamber 192A connected to intermediate robot chamber 180A and a preclean/degas chamber 192B connected to intermediate robot chamber 180B. A substrate loaded into one of the loadlock chambers 130A, 130B from the front end 120 is moved, by the associated intermediate robot 185A or 185B, from the loadlock chamber 130A or 130B and into the preclean/degas chamber 192A or 192B. In the preclean/degas chambers 192A, 192B, the substrate is heated to volatilize any adsorbed moisture or other volatilizable materials therefrom, and is subjected to a plasma etch process whereby residual contaminant materials thereon are removed. Thereafter, the substrate is moved by the appropriate associated intermediate robot 185A or 185B back into the corresponding intermediate robot chamber 180A or 180B and thence onto a support chuck assembly 392 (FIG. 3A) at a process station 160 in the substrate processing module 150, here process station 160A or 160F. In some embodiments, the substrate S is placed on a detachable portion (not shown) of the support chuck assembly 392, it remains thereon until all processing thereof in the processing module 150 is completed.

Here, each of the loadlock chamber 130A and the loadlock chamber 130B is connected to a vacuum pump (not shown), for example a roughing pump, the output of which is connected to an exhaust duct (not shown), to reduce the pressure within the loadlock chamber 130A, 130B to a sub-atmospheric pressure on the order of about $10^{-3}$ Torr or less. Each loadlock chamber 130A or 130B may be connected to a vacuum pump dedicated thereto, or a vacuum pump shared with one or more components within the processing system 100, or to a house exhaust other than a vacuum pump to reduce the pressure therein. In each case, a valve (not shown) can be provided on the loadlock chamber 130A, 130B exhaust to the pump or house exhaust to isolate, or substantially isolate, the pumping outlet of the loadlock chamber 130A, 130B connected to the vacuum pump or house exhaust from the interior volume of the loadlock chamber 130A, 130B when the first valve 125A or 125B respectively is open and the interior of the loadlock chamber 130A, 130B is exposed to atmospheric or ambient pressure conditions.

After the substrate has been processed, for example, in the, preclean/degas chamber 192B, the intermediate robot 185B removes the substrate from the preclean/degas chamber 192B. A process chamber valve 144B, which is disposed between the intermediate robot chamber 180B and the processing module 150, is opened to expose an opening 204B (FIGS. 2, 3A, and 3B) formed in a wall of the processing module 150, and the intermediate robot 185B moves the substrate through the opening 204B to a process station 160F of the processing module 150 where it is received for processing within one or more of the process stations of the processing module 150. In the same manner, a substrate can be moved from the front end 120 through the loadlock chamber 130A, to the preclean/degas chamber 192A, and then to the processing module 150 through a process chamber valve 144A (FIG. 2A) and an opening in the processing module 150 wall to be received at process station 160A. Alternatively, the process chamber valves 144A, 144B may be eliminated, and intermediate robot chambers 180A, 180B be in direct uninterrupted fluid communication with the interior of the processing module 150.

Each of the loadlock chambers 130A, 130B and intermediate robot chambers 180A, 180B are configured to pass substrates from the front end 120 into the processing module 150, as well as from the processing module 150 and into the front end 120. Thus, with respect to the first intermediate robot chamber 180A, to remove a substrate positioned at process station 160A of the processing module 150, the process chamber valve 144A is opened, and the intermediate robot 185A removes the substrate from the process station 160A and moves it, through an open second valve 135A connected between the intermediate robot chamber 180A and the loadlock chamber 130A, to place the substrate in the loadlock chamber 130A. The end effector of the intermediate robot 185A on which the substrate was moved is retracted from the loadlock chamber 130A, the second valve 135A thereof is closed, and the interior volume of the loadlock chamber 130A is optionally isolated from the vacuum pump connected thereto. Then the first valve 125A connected to the loadlock chamber 130A is opened, and the front end 120 robot picks up the substrate in the loadlock chamber 130A and moves it to a storage location, such as a cassette or FOUP 110, located within or connected to a sidewall of, the front end 120. In a similar fashion, using the intermediate robot chamber 180B, the intermediate robot 185B, the loadlock chamber 130B and associated valves 135B and 125B thereof, a substrate can be moved from the process station 160F location to the front end 120.

During the movement of a substrate from the processing module 150 to the front end 10, a different substrate may be located within the preclean/degas chamber 192A, 192B connected to the intermediate robot chamber 180A, 180B through which the substrate being moved to the front end 120 passes. Because each preclean/degas chamber 192A, 192B is isolated from the intermediate robot chamber 180A, 180B to which it is attached by a valve, passage of a different substrate can be undertaken from the processing module 150 to the front end 120 without interfering with the processing of a substrate in the respective preclean/degas chambers 192A, 192B.

The system controller 199 controls activities and operating parameters of the automated components found in the processing system 100. In general, the bulk of the movement of a substrate through the processing system is performed using the various automated devices disclosed herein by use of commands sent by the system controller 199. The system controller 199 is a general use computer that is used to control one or more components found in the processing system 100. The system controller 199 is generally designed to facilitate the control and automation of one or more of the processing sequences disclosed herein and typically includes a central processing unit (CPU) (not shown), memory (not shown), and support circuits (or I/O) (not shown). Software instructions and data can be coded and stored within the memory (e.g., non-transitory computer readable medium) for instructing the CPU. A program (or computer instructions) readable by the processing unit within the system controller determines which tasks are performable in the processing system. For example, the non-transitory computer readable medium includes a program which when executed by the processing unit are configured to perform one or more of the methods described herein. Preferably, the program includes code to perform tasks relating to monitoring, execution and control of the movement, support, and/or positioning of a substrate along with the various process recipe tasks and various processing module process recipe steps being performed.

Figure 2:
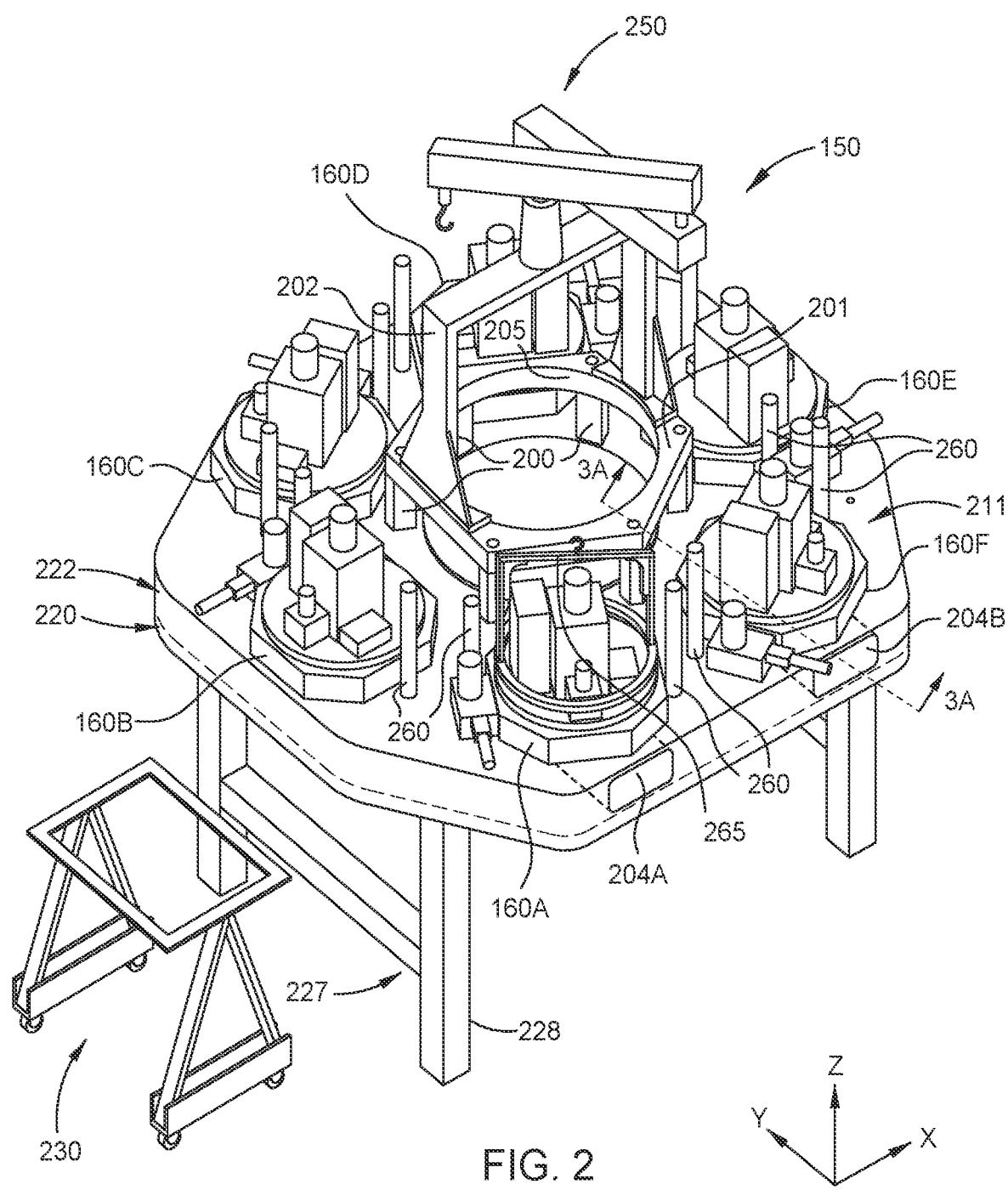
FIG. 2 is an isometric view of the processing module of FIG. 1 that includes a structural support assembly and a lift assembly, according to one or more embodiments.

FIG. 2 is an isometric view of the processing module 150 of FIG. 1, which includes a structural support assembly 205 and a lift assembly 250, according to one or more embodiments. The processing module 150 includes a lower monolith 220 forming the lower portion or base of the processing module 150, and an upper monolith 222 that is sealed thereto and supported thereon. In some embodiments, lower monolith 220 and the upper monolith 222 are welded, brazed or fused together by some desirable means to form a vacuum tight joint at the interface between the lower monolith 220 and the upper monolith 222. A lower supporting structure 227, which includes a support frame 228, is used to support the lower monolith 220 and the upper monolith 222 and position the processing module 150 at a desired vertical position above a floor (not shown).

To minimize the distortion of the processing module 150, a structural support assembly 205 is used to reduce the distortion of the chamber upper wall lower monolith 220 and the upper monolith 222 and improve the parallelism of surfaces within the processing module 150 whether the processing module 150 is under vacuum or at ambient pressure. Here, to help ensure parallelism, the upper monolith 222 includes the structural support assembly 205 that includes an upper support element 201 and a plurality of mounting elements 200 that each have a first end that is coupled to an upper module surface 211. In some embodiments, the first end of the mounting elements 200 are coupled to the upper module surface 211 by bolting, welding, or even integrally forming the mounting elements 200 as part of the upper module surface 211. The array of mounting elements 200 are positioned on and coupled to the upper module surface 211 between each of the process stations 160A-160F. In some embodiments, the array of mounting elements each have a first end that is coupled to the upper module surface 211 at a radial position that is positioned on a radial direction that extends between two adjacent process station openings.

In some embodiments, the structural support assembly 205 generally comprises a toroidal shaped upper support element 201 that is coupled to a second end of each of the mounting elements 200 to minimize the deflection of the processing module 150. The upper support element 201 is coupled to each of the mounting elements 200 by bolting, welding, or even integrally forming the mounting elements 200 as part of the upper support element 201. The mounting elements 200 are configured to position the upper support element 201 a distance between about 150 mm and about 450 mm from the mounting surface (e.g., upper module surface 211). In some embodiments, the upper support element 201 and the mounting elements 200 are formed from the same material as the material used to form the upper monolith 222 and lower monolith 220 components, such as an aluminum material (e.g., 6061 Al). In some embodiments, the upper support element 201 and the mounting elements 200 are formed from a material that has a modulus of elasticity (E) that is greater than the material used to form the upper monolith 222 and lower monolith 220 components, such as an stainless steel material (e.g., 304 SST, 316 SST) and the upper monolith 222 and lower monolith 220 components are formed from an aluminum material.

A plurality of guide posts 260 are disposed on the upper module surface 211 of the processing module 150. The plurality of guide posts 260 are disposed adjacent each of the process stations 160A-160F. As shown in FIG. 2, the ratio of guide posts 260 to process stations 160A-160F is 2:1, such that there are two guide posts adjacent each of the process stations 160A-160F. The two guide posts are disposed on opposite sides of the process stations 160A-160F. In an embodiment in which six process stations 160A-160F are utilized, there may be twelve guide posts 260. The guide posts 260 are configured to guide a lift cage, such as the lift cage 265 over the process stations 160A-160F, such that the lift cage 265 may be coupled to a portion of the process stations 160A-160F in a properly aligned manner. The lift cage 265 may then be coupled to the lift assembly 250 so that at least a portion of the process stations 160A-160F may be lifted from the processing module 150.

The lift assembly 250 is disposed on top of the upper support element 201 of the structural support assembly 205. The lift assembly includes at least two support legs 202. The support legs 202 are coupled to the top of the upper support element 201, such that the lift assembly 250 is disposed over the center of the processing module 150 radially inward of each of the process stations 160A-160F. By positioning the lift assembly 250 between each of the process stations 160A-160F, the lift assembly 250 may be utilized for the removal or placement of portions of any of the process stations 160A-160F without the need to be moved during times when the lift assembly 250 is not being used. The structural support assembly 205 is configured to reduce the deformation of the processing module 150, when a pressure below atmospheric pressure is formed within the transfer region 310 (FIG. 3A), even with the added weight of the lift assembly 250 disposed thereon. The positioning of the lift assembly 250 in the central portion of the processing module 150 further reduces the length of the arms needed to perform the removal or placement of portions of any of the process stations 160A-160F and may therefore reduce the overall moment which is applied to the lift assembly 250 and subsequently the processing module 150 while the arm of the lift assembly 250 is extended to remove a portion of a process station 160A-160F or place a portion of the process stations 160A-160F on a maintenance table, such as the maintenance table 230.

Process Station Hardware Examples

Figure 3A:
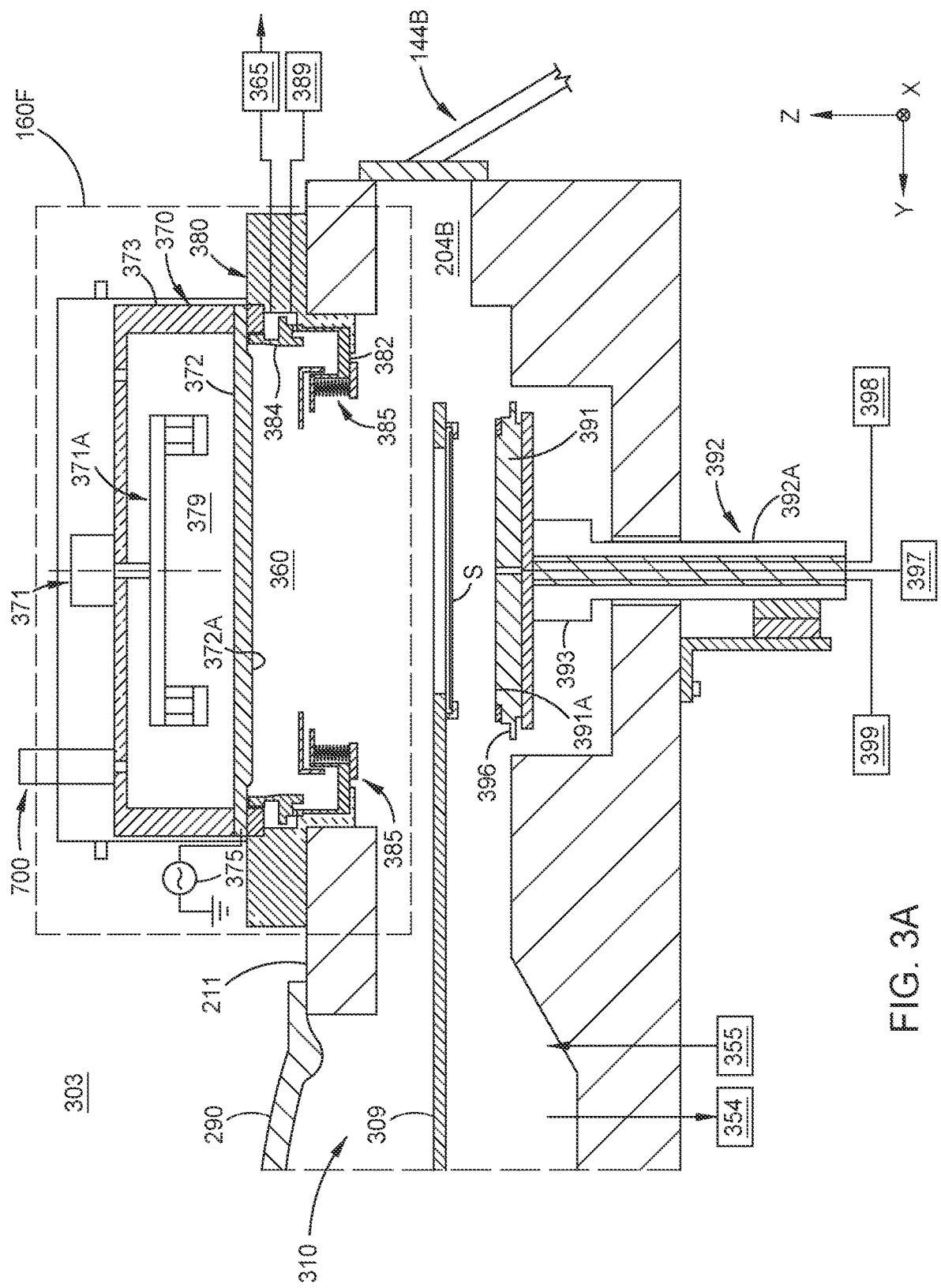
FIG. 3A is a partial sectional view of a portion of the processing module of FIG. 1, showing a configuration of a substrate support in a transfer position below a process station of the processing module, according to one or more embodiments.
Figure 3B:
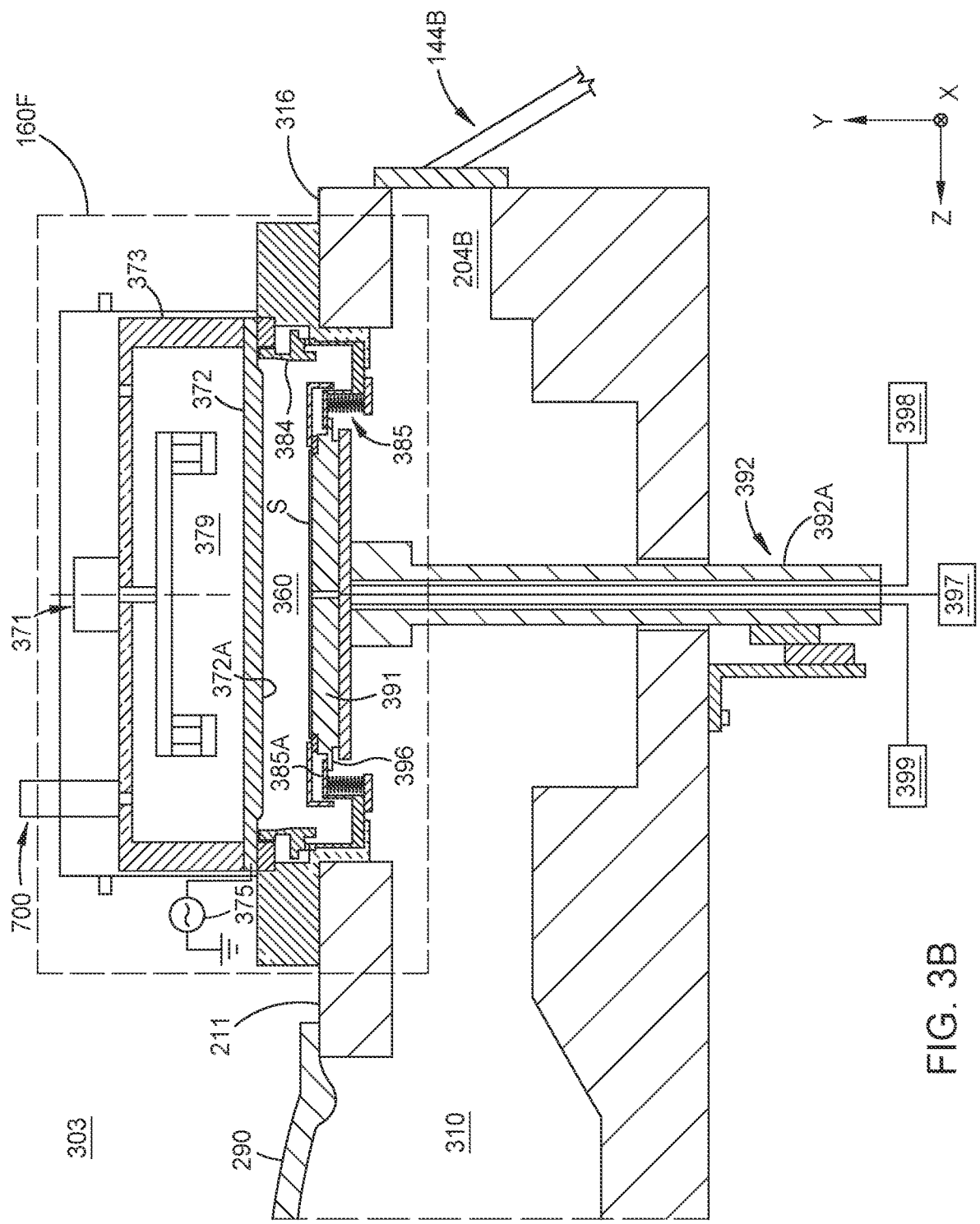
FIG. 3B is a partial cross-sectional view of the processing module of FIG. 1, showing an alternate configuration of the substrate support illustrated in FIG. 3A lifted into a process position to form a sealed substrate process volume therewith, according to one or more embodiments.

FIGS. 3A and 3B are partial sectional views of a portion of the processing module 150 of FIG. 1, showing a configuration of a substrate support in a transfer position below a process station 160F of the processing module, according to one or more embodiments. In this configuration, the processing module 150 includes a transfer device 155 (FIG. 1) that includes a plurality of support arms 309 that are configured to transfer and deposit one or more substrates onto a substrate support surface 391A of a support chuck 391. The substrate support surface 391A is formed on the support chuck 391 that is attached to the pedestal shaft 392A.

FIG. 3A illustrates the support chuck assembly 392 that is positioned in a substrate receiving position or substrate transfer position. FIG. 3B illustrates the support chuck assembly 392 while it is positioned in a substrate processing position. The support chuck assembly 392 configurations illustrated in FIGS. 3A-3B illustrate a design in which a support chuck 391 of the support chuck assembly 392 remains attached to the pedestal lift assembly components such that it is dedicated to a single process station 160F, and is limited to moving a substrate vertically, such as moving the substrate between the substrate receiving position and the processing position.

The support chuck assembly 392 includes a heater power source 398, an electrostatic chuck power source 399 and a backside gas source 397. The heater power source 398 and/or electrostatic chuck power source 399 are each electrically coupled the one or more electrical elements formed within the substrate support chuck 391. In this configuration, the body of the support chuck 391 includes one or more resistive heating elements embedded therein. The resistive heating elements are disposed within the body of the substrate support chuck 391 and are in electrical communication with the output connections of the heater power source 398. The one or more chucking electrodes disposed within the body of the substrate support chuck 391 are in electrical communication with the electrostatic chuck power supply 399. In one example, three wires that are coupled to the output of the heater power source 398 and two wires that are coupled to the electrostatic chuck power source 399 are provided through pedestal shaft 392A so that they can be separately connected to their respective electrical elements.

As similarly discussed above, during processing, when the substrate and support chuck assembly 392 are positioned in a processing position below the source assembly 370, a portion of the support chuck assembly 392, or component attached thereto, includes a sealing surface 396 that is adapted to form a "seal" with a portion of the sealing assembly 385 so as to substantially fluidly isolate the processing region 360 from the transfer region 310. In some embodiments, the "seal" formed between the sealing surface 396 and the sealing assembly 385 is created by the physical contact created between a surface of the sealing surface 396 and a surface of the portion of the sealing assembly 385. As similarly discussed above, in some lower temperature applications, the seal is formed by use of wiper seal, u-cup seal or an O-ring (not shown) that is positioned at the interface between the sealing surface 396 of the support chuck assembly 392 and the surface of the portion of the sealing assembly 385. Also, in some high temperature applications, such as at temperatures greater than 200° C., the seal is formed by metal-to-metal, or metal-to-ceramic contact formed at the interface between the portion of the sealing surface 396 of the support chuck assembly 392 and the portion of the sealing assembly 385.

Referring to FIG. 3A, the transfer device 155 includes a plurality of support arms 309 that are configured to pick-up and deposit one or more substrates onto the substrate support surface 391A of a support chuck assembly 392. In one embodiment, the transfer device 155 includes a lift mechanism (not show) that is configured to at least raise and lower the plurality of support arms 309 attached thereto from a transfer position to a substrate drop off position, which is below the transfer position. A similar robot arm configuration, or end of a robotic arm, as the support arm 309 may also be utilized as part of the end effector of the transfer device 155 to pick-up and drop-off substrates on the substrate support surface 391A of the substrate support chuck 391.

The processing regions 360 of each process station 160A-160F can be separately and selectively isolated by controlling the movement and position of the support chuck assembly 392 at each process station 160A-160F based on commands sent from a system controller 199 (FIG. 1).

The source assembly 370 forms a portion of each of the process stations 160A-160F. The source assembly 370 includes a target 372, a magnetron assembly 371, source assembly walls 373, and a sputtering power supply 375. In this configuration, a processing surface 372A of the PVD target 372 generally defines at least a portion of the upper portion of the process stations 160A-160F. The magnetron assembly 371 includes a magnetron region 379 in which the magnetron 371A is rotated by use of a magnetron rotation motor 376 during processing. The target 372 and magnetron assembly 371 are typically cooled by the delivery of a cooling fluid (e.g., DI water) to the magnetron region 379 from a fluid recirculation device, such as a fluid return column 700, a first fluid connection 408, or a second fluid connection 409 (FIGS. 4A, 4B, 6, 7A, and 7B). The magnetron 371A includes a plurality of magnets 371B that are configured to generate magnetic fields that extend below the processing surface 372A of the target 272 to promote a sputtering process performed in the processing region 360 during a PVD deposition process.

Alternate configurations of the process stations 160F, which are adapted to perform CVD, PECVD, ALD, PEALD, etch, or thermal processes, the source assembly 370 will generally include different hardware components. In one example, the source assembly 370 of a process station that is adapted to perform a CVD deposition process, a PECVD deposition process or an etch process will include a gas distribution plate, or showerhead, that is configured to deliver a precursor gas or etching gas into the processing region 360 and across a surface of a substrate disposed within the process station 160F during processing. Generally, a showerhead, or gas distribution plate, includes a metal, quartz or ceramic plate that has a plurality of holes (e.g., >100 holes) formed therein to restrict and thus allow an even distribution of a gas to flow from an upstream side of the showerhead to a downstream side of the showerhead, which is positioned adjacent to the processing region 360 of a processing station 160A-160F during processing. The gas (e.g., precursor gas or etching gas) is delivered to the upstream side of the showerhead and through the showerhead by a precursor gas source (not shown) typically disposed outside of the processing system 100. In this configuration of the source assembly 370, the one or more processing surfaces that define at least a portion of the processing region 360 is the lower surface of the gas distribution plate, or showerhead (e.g., surfaces that contact the processing region). In this configuration, the magnetron assembly 371 and target are not used, and the sputtering power supply 375 can be replaced with a RF power supply that is configured to bias the gas distribution plate.

The processing region 360 is further formed by a process kit assembly 380. The process kit assembly 380 includes one or more liners 382, a processing region body, and the sealing assembly 385. A process gas supply 389 and an exhaust pump 365 are further coupled to the process kit assembly 380 and in fluid communication with the processing region 360, such that the process gas supply 389 supplies process gases to the processing region 360 and the exhaust pump 365 evacuates and pumps down the processing region 360.

The central opening 213 of FIG. 1 is covered with a central opening lid 290. The central opening lid 290 is coupled to the upper module surface 211 of the processing module 150. The central opening lid 290 separates the transfer region 310 from the outer area 303, wherein the outer area 303 is an outside volume (i.e., external environment) surrounding the processing module 150. The central opening lid 290 and the process stations 160A-160F fluidly seal the processing module 150. Therefore, the transfer region 310 may be pumped down to a vacuum by a transfer volume pump 354. A transfer volume gas supply 355 may also be coupled to the transfer region 310. The transfer volume gas supply 355 may supply an inert gas or other process gas to the transfer region 310.

As previously disclosed, FIG. 3B is a partial cross-sectional view of the processing module 140 of FIG. 1, showing the support chuck assembly 392 illustrated in FIG. 3A lifted into a process position to form a sealed substrate process volume therewith, according to one or more embodiments. When the support chuck assembly 392 is raised to the process position, the sealing surface 396 of the support chuck assembly 392 and the seal assembly sealing surface 385A of the sealing assembly 385 are pressed together to form a seal between the transfer region 310 and the processing region 360. The seal fluidly isolates the processing region 360 from the transfer region 310 and a process is performed on a substrate S within the processing region 360. The support chuck assembly 392 may also be raised to fluidly isolate the transfer region 310 from the outer area 303 when one of the process stations 160A-160F are removed for maintenance or replacement. Removal of the process stations 160A-160F may comprise removal of a combination of one or more of the source assembly 370 and the process kit assembly. The sealing assembly 385 may be left in place while maintenance is performed on other components of the process stations 160A-160F to prevent atmospheric gases from entering the transfer region 310.

Preventative Maintenance Hardware Examples

FIGS. 4A and 4B are schematic side views of a process station 160F with a lift cage 265 disposed thereon, according to one or more embodiments. The lift cage 265 is coupled to a station lift component 270 that is coupled to a portion of the process station 160F, such as the source assembly 370 that is described above. The process station 160F includes an outer source assembly casing 402 and a station process component tower 406, which form part of the source assembly 370. The station process component tower 406 is disposed on top of the outer source assembly casing 402.

The outer source assembly casing 402 includes a bottom surface 403, coupling components 430, a top surface 401, and a docking unit 440. The outer source assembly casing 402 is an outer casing of the outer source assembly walls 373 (FIGS. 3A-3B). In some embodiments, the outer source assembly walls 373 form at least part of the outer source assembly casing 402. The station process component tower 406 includes a first fluid connection 408, a second fluid connection 409, a third fluid connection 436 and an electrical coupling 452. The station process component tower 406 includes the motor of the magnetron assembly 371 (FIGS. 3A-3B) disposed thereon, conduits for fluid communication with the magnetron region 379 (FIGS. 3A-3B), and pumps for evacuation of the processing region 360. In some embodiments, components associated with the vacuum pump 165 (FIG. 1) are disposed within the station process component tower 406, such as a turbo pump, final valve and pumping line(s) that are connect to a vacuum pump. The station process component tower 406 is disposed on top of the top surface 401 of the outer source assembly casing 402. The third fluid connection 436 is additionally disposed on the top surface 401 of the outer source assembly casing 402.

Although not shown in FIGS. 4A and 4B, the fluid return column 700 may be coupled to the third fluid connection 436. In some embodiments only two of the first fluid connection 408, the second fluid connection 409, or the third fluid connection 436 are present, such as the first fluid connection 408 and the third fluid connection 436. Each of the fluid connections 408, 409, and 436 may serve as either a fluid inlet or a fluid outlet for flowing of water or other fluids through the magnetron region 379 (FIGS. 3A-3B).

The bottom surface 403 of the outer source assembly casing 402 includes one or more coupling components 430 disposed thereon. The one or more coupling components 430 are disposed on or adjacent to the bottom surface 403 and assist in guiding the process station 160F onto the processing module 150. The one or more coupling components 430 may couple the process station 160F to a surface of the processing module 150. In some embodiments, the one or more coupling components 430 include a protrusion and may be aligned with divots or grooves (not shown) formed in the upper module surface 211 of the processing module 150. The presence and use of protrusions and divots or grooves ensures proper positioning of the process station 160F when the process station 160F is placed on the processing module 150. With the placement of the process station 160F onto the processing module 150, the docking unit 440 may similarly couple to a mating unit 805 (FIG. 8C). The docking unit 440 enables the automatic coupling of one or more of the electrical connections, the gas connections, or fluid connections as described herein. The docking unit 440 and the coupling components 430 should be aligned closely with their respective mating components. The lift cage 265 includes alignment guides 425 to assist in the alignment of the process station 160F with the processing module 150.

A lift ring 410 can be coupled to any one of the process stations 160A-160F and, when present, forms a portion of the station lift component 270. The lift ring 410 is coupled to the top surface 401 of the outer source assembly casing 402 of the process station 160F. The lift ring 410 is coupled to the top surface 401 of the outer source assembly casing 402 by one or more lift ring connections 407, and is used to distribute a lift force across multiple locations along the top surface 401 of the outer source assembly casing 402 when the lift cage 265 is positioned to support the weight of the process station during maintenance activities. The lift ring connections 407 connect the lift ring 410 and the top surface 401 of the outer source assembly casing 402. The lift ring connections 407 may be bolts, an adhesive, or a material welded between the lift ring 410 and the top surface 401. The lift ring 410 is disposed around the station process component tower 406, such that the station process component tower 406 is disposed within the central opening in the lift ring 410. The lift ring 410 further includes a bolt connector 405 that includes a lever and can be utilized to easily attach and detach the lift ring 410 from the lift cage 265.

The lift cage 265 includes two or more arms 414 and a span component 413 disposed between the arms 414. In the embodiment disclosed herein, a frame assembly 412 includes two arms 414 and a span component 413 disposed between the two arms 414. The span component 413 couples the two arms 414 together at an uppermost distal end of the two arms 414. Each of the arms 414 are coupled to the span component 413 by a bracket 416. The bracket 416 is connected to both the span component 413 and an arm 414. The bracket 416 may be a corner bracket, such as an L-bracket, or an angled bracket, such that the bracket 416 is coupled to the inner surface of each of the two arms 414 and an underside of the span component 413.

A cage clasp 418 is disposed on and connected to the span component 413 of the lift cage 265. The cage clasp 418 is disposed above the span component 413 and extends from the span component 413 in the opposite direction of the two arms 414. The cage clasp 418 is shown herein as a hook, but other equally effective versions of cage clasps may be utilized. In some embodiments, the cage clasp 418 may be a magnetic clasp or comprises a ferromagnetic material and can be coupled to the lift assembly 250 by an electromagnet. In yet other embodiments, the cage clasp 418 includes a lobster claw clasp, which can be closed to provide additional security to the process stations 160A-160F while being moved. The lobster claw clasp is similar to a carabineer and includes a hook with an actuatable portion for closing the open end of the hook.

Each of the arms 414 include a coupling portion 420 and an alignment guide 425. The alignment guide 425 is configured to guide the movement of the process station 160A-160F along the guide posts 260. The alignment guide 425 corrects for misalignment between the lift cage 265 and the guide posts 260 while additionally preventing the process station 160A-160F from tilting to an angled position during the transfer of a portion of the process station 160A-160F to and from the processing module 150. Each of the alignment guides 425 are positioned radially outward from the center of the lift cage 265, such that the alignment guides 425 extend from the opposite side of the surface from the bracket 416 and each alignment guide 425 face away from each other. The coupling portion 420 protrudes inward from the lift cage 265, such that the coupling portion 420 extends in an opposite direction from the alignment guides 425. The coupling portion 420 includes an opening 422 disposed thereon, such that the walls of the opening 422 are meant to align with the bolt connector 405 as shown in FIG. 4B. After the bolt connector 405 is aligned with the opening 422 of the coupling portion 420, the bolt connector 405 may be inserted into the opening 422 and fixed in place by actuating the bolt connector 405 to a locked position.

The alignment guides 425 are configured to align the lift cage 265 with the guide posts 260. The guide posts 260 are typically cylindrical posts disposed on and/or coupled to the top of the processing module 150. FIG. 4A shows the lift cage 265 positioned above the process station 160F, but not yet coupled to or engaged with the process station 160F. During one or more portions of the process of placing or removing the source assembly 370 from process station during a maintenance activity, the alignment guides 425 are roughly aligned with the top portions of the guide posts 260 either before or simultaneously with the lowering of the lift cage 265 to a coupling position as shown in FIG. 4B. In some embodiments, the guide posts 260 have a tapered top to decrease the difficulty in aligning the lift cage 265 with the guide posts 260.

FIG. 4B illustrates the lift cage 265 in a coupling position with respect to the station lift component 270. A first set of alignment protrusions 432 and a second set of alignment protrusions 434 are disposed on each of the alignment guides 425. The first and second sets of alignment protrusions 432, 434 are configured to guide the lift cage 265 over the guide posts 260 by contacting the sides of the guide posts 260 as the lift cage 265 is lowered. The alignment protrusions 432, 434 are cylindrical posts and are rotatable about an axis to allow the alignment protrusions 432, 434 to slide along the guide posts 260. The first set of alignment protrusions 432 are disposed below the second set of alignment protrusions 434 and further from the span component 413. The first set of alignment protrusions 432 being vertically offset from the second set of alignment protrusions 434 assists in preventing the lift cage 265 from tilting relative to a lift axis L as the lift cage 265 is lowered or raised. The lift axis L is parallel to a Z-axis and normal to an X-axis. This is beneficial if the center of gravity of the lift cage 265 or the process stations 160A-160F is not centered and can assist in enabling the use of the docking unit 440 or the coupling components 430 by allowing precise alignment of the docking unit 440 to a mating unit 805 (FIG. 8C) and the coupling components 430 to divots or grooves (not shown) formed in the upper module surface 211 of the processing module 150 (FIG. 2). The alignment protrusions 432 and the guide posts 260, when used together, are able to adjust and align the position of the process stations 160A-160F before the process station 160A-160F is lowered to contact the upper module surface 211. The first set of alignment protrusions 432 and the second set of alignment protrusions 434 are similar in size and structure.

Figure 4C:
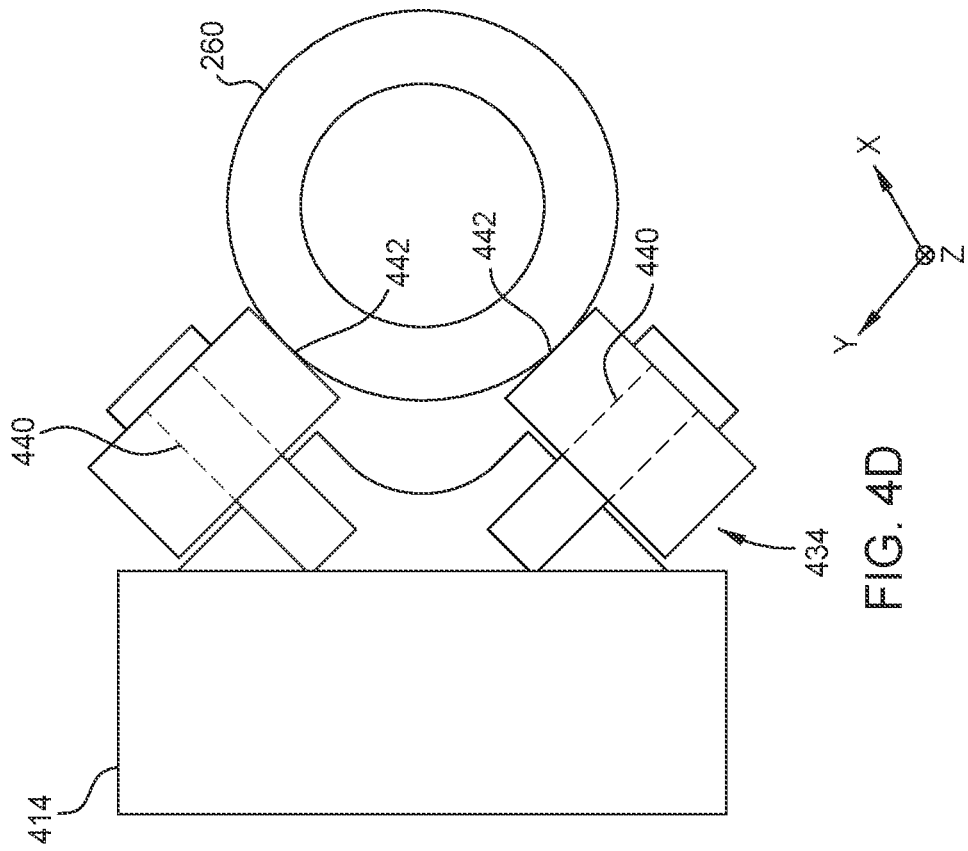
FIG. 4C is a schematic plan view of a misoriented portion of the lift cage, according to one or more embodiments.

FIG. 4C is a schematic cross-sectional plan view of a portion of the lift cage 265 that provides more detail regarding the second set of alignment protrusions 434 as viewed in the negative Z-direction. Each of the alignment protrusions 434 include a shaft 446 and a cylindrical contact component 442 disposed on the shaft 446. The shafts 446 of the second set of alignment protrusions 434 are coupled to each of the arms 414. A shaft 446 is disposed through each of a cylindrical contact component 442. The cylindrical contact components 442 may be either fixed to the shafts 446 or configured to rotate about the shafts 446, such that the cylindrical contact components 442 act as a wheel.

Figure 4D:
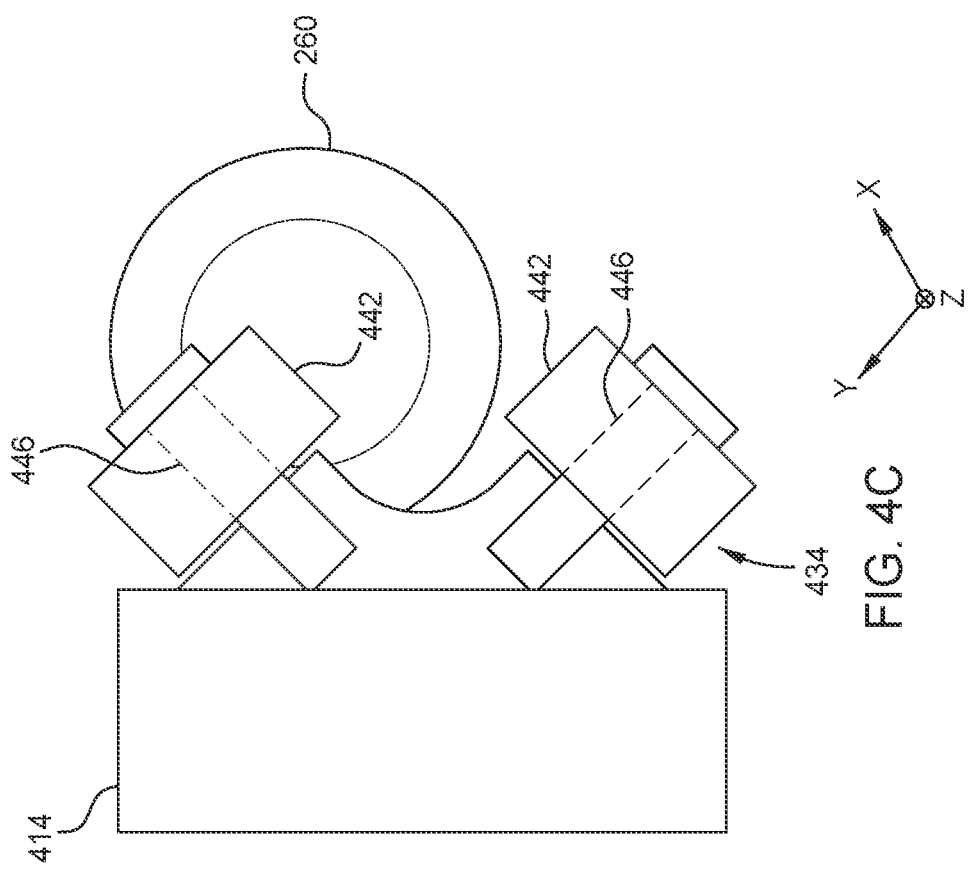
FIG. 4D is a schematic plan view of an aligned portion of the lift cage, according to one or more embodiments.

The cylindrical contact components 442 are cylindrical to reduce contact friction with the guide posts 260 when the cylindrical contact components 442 contact the guide posts 260. Each of the cylindrical contact components 442 extend in different directions and form a general V-shape. In some embodiments, the cylindrical contact components 442 extend at different angles, such as a perpendicular angle. The cylindrical contact components 442 are configured to self-align with the guide posts 260. As shown in FIG. 4C, the cylindrical contact components 442 are initially not aligned with the guide posts 260, but as the cylindrical contact components 442 contact the top surface of the guide posts 260 as the frame assembly 412 is lowered, the cylindrical contact components 442 will align the cylindrical contact components 442 with the guide posts 260 such that both of the cylindrical contact components 442 contact the guide posts 260, as illustrated in FIG. 4D. FIG. 4D illustrates one of the arms 414 aligned with the guide post 260 due to a surface of each of the cylindrical contact components 442 engaging with and contacting an outer surface of the guide post 260. Therefore, when the arms 414, on opposing sides of the lift cage 265, are aligned and engaged with their respective guide post, the lift cage 265 and portion of the source assembly 370 are aligned so that the lift cage 265 and source assembly 370 can be coupled or decoupled from each other as required to perform subsequent maintenance related activity steps. Aligning the lift cage 265 additionally enables the process stations 160F to be picked up and lowered from the processing module 150 in a repeatable manner after the coupling of the lift cage 265 and the source assembly 370. The repeatable picking up and lowering of the process station 160F enables the coupling components 430 and the docking unit 440 to be aligned with their respective mating components and cause the source assembly 370 to be aligned with the lower portion of the processing station 160F, which can minimize or prevent arcing between the source assembly components (e.g., target 372) and adjacent grounded portions of the processing station (e.g., chamber liners 384 (FIGS. 3A-3B)) during processing. The alignment includes a reduced angle between the bottom surface 403 of the outer source assembly casing 402 and the upper module surface 211.

Figure 4F:
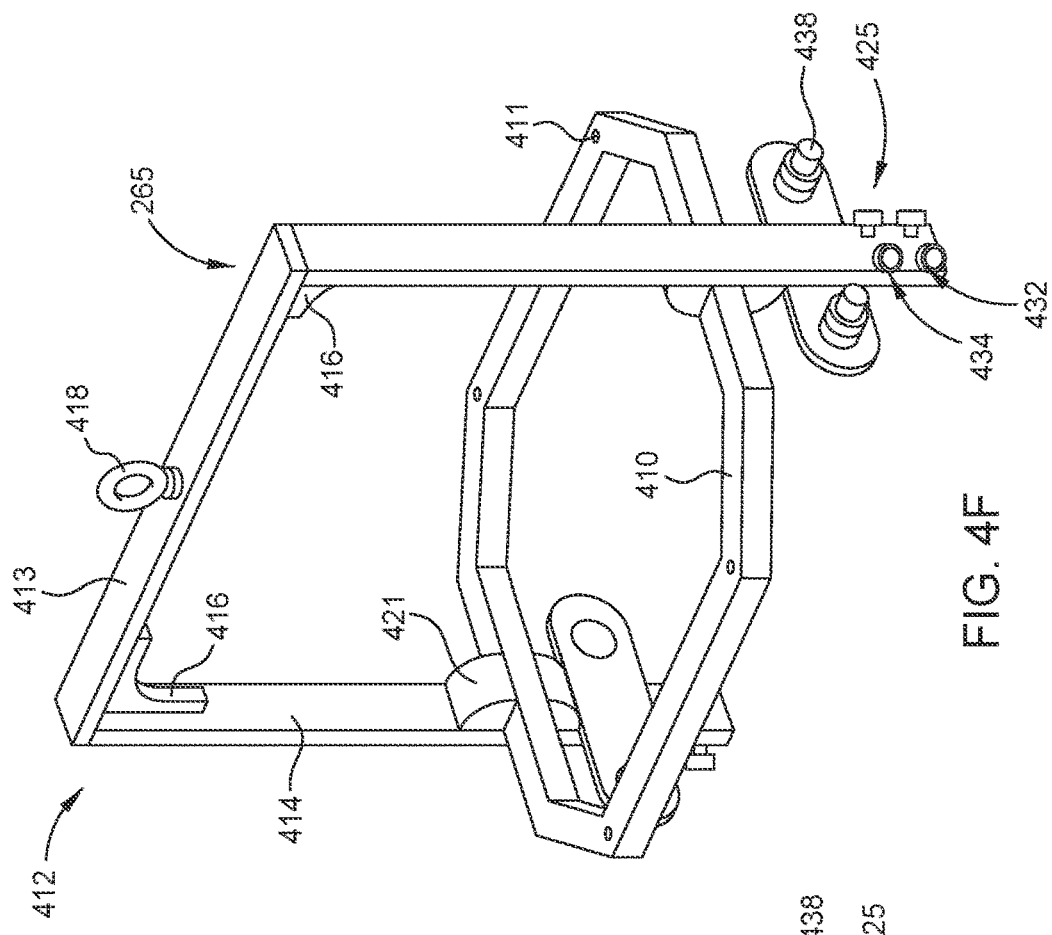
FIG. 4F is an isometric view of an alternative lift cage of FIGS. 4A and 4B according to one or more embodiments.
Figure 4E:
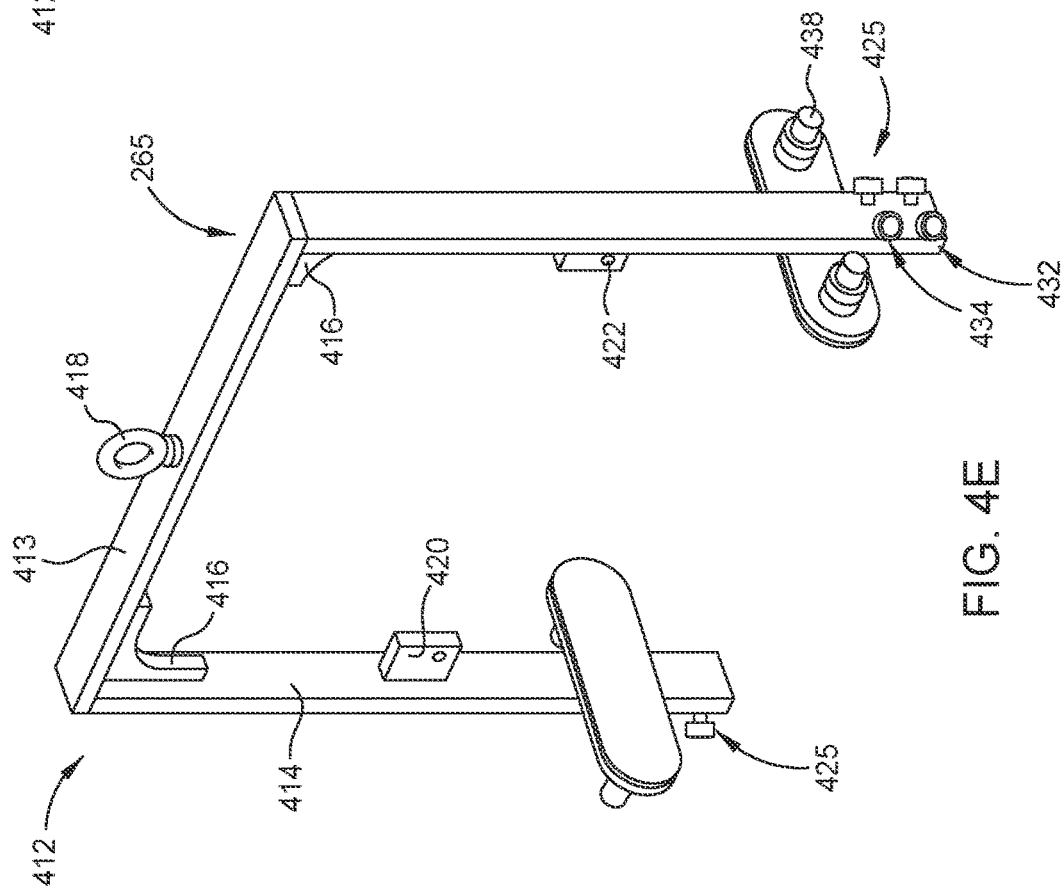
FIG. 4E is an isometric view of the lift cage of FIGS. 4A and 4B according to one or more embodiments.

FIG. 4E is an isometric view of the lift cage 265 separate from any of the process stations 160A-160F. The lift cage 265 as shown in FIG. 4E includes the frame assembly 412 with the coupling portion 420 and the alignment guides 425. The lift cage 265 is separate from the lift ring 410 as shown in FIGS. 4A and 4B. Alternatively, the lift cage 265 is permanently connected to the lift ring 410 as shown in FIG. 4F. As shown in FIG. 4E, the alignment protrusions 432 and 434 are still coupled to the outer surface of the frame assembly 412 as part of the alignment guides 425. The alignment guides 425 may further include a module contact portion with protrusions 438 disposed above the alignment protrusions 434. The protrusions 438 are disposed outward. The contact portion is configured to contact a wall of the process station, such as the process station 160F while the protrusions 438 secure the lift cage 265 and the process station 160F to a maintenance table, such as the maintenance table 230 (FIG. 2). The protrusions 438 may be meant to be fit into grooves within the maintenance table (not shown) while the process station 160F is disposed on the maintenance table for maintenance. The module contact portion extends along the wall of the process station with adjustable protrusions to enable the lift cage 265 to grip the process module 160F and reduce swinging or rotation of the lift cage 265 relative to the process module 160F.

FIG. 4F is an isometric view of the lift cage 265 and the lift ring 410 separate from any of the process stations 160A-160F. The lift cage 265 as shown in FIG. 4F includes the frame assembly 412 permanently coupled to the lift ring 410 via a coupling portion 421. When the lift cage 265 is permanently coupled to the lift ring 410, there is a lift cage 265 coupled to each of the process stations 160A-160F and the lift cage 265 is not removed or re-attached between lift operations. The utilization of the lift cage 265 of FIG. 4F enables a simplified method or removal and replacement of the process station 160A-160F, but increased the hardware costs associated with the use of the lift assembly described herein. Other aspects of the embodiment of the lift cage 265 of FIG. 4F are the same as the lift cage 265 of FIG. 4E. FIG. 4F additionally illustrates a plurality of fastener openings 411 through which a mechanical fastener may be disposed. The fastener openings 411 are used to couple the lift ring 410 to a portion of the process stations 160A-160F, such as the lift ring connection 407 of FIGS. 4A and 4B. Exemplary fasteners which may be disposed through the fastener openings 411 includes screws and bolts.

Figure 5:
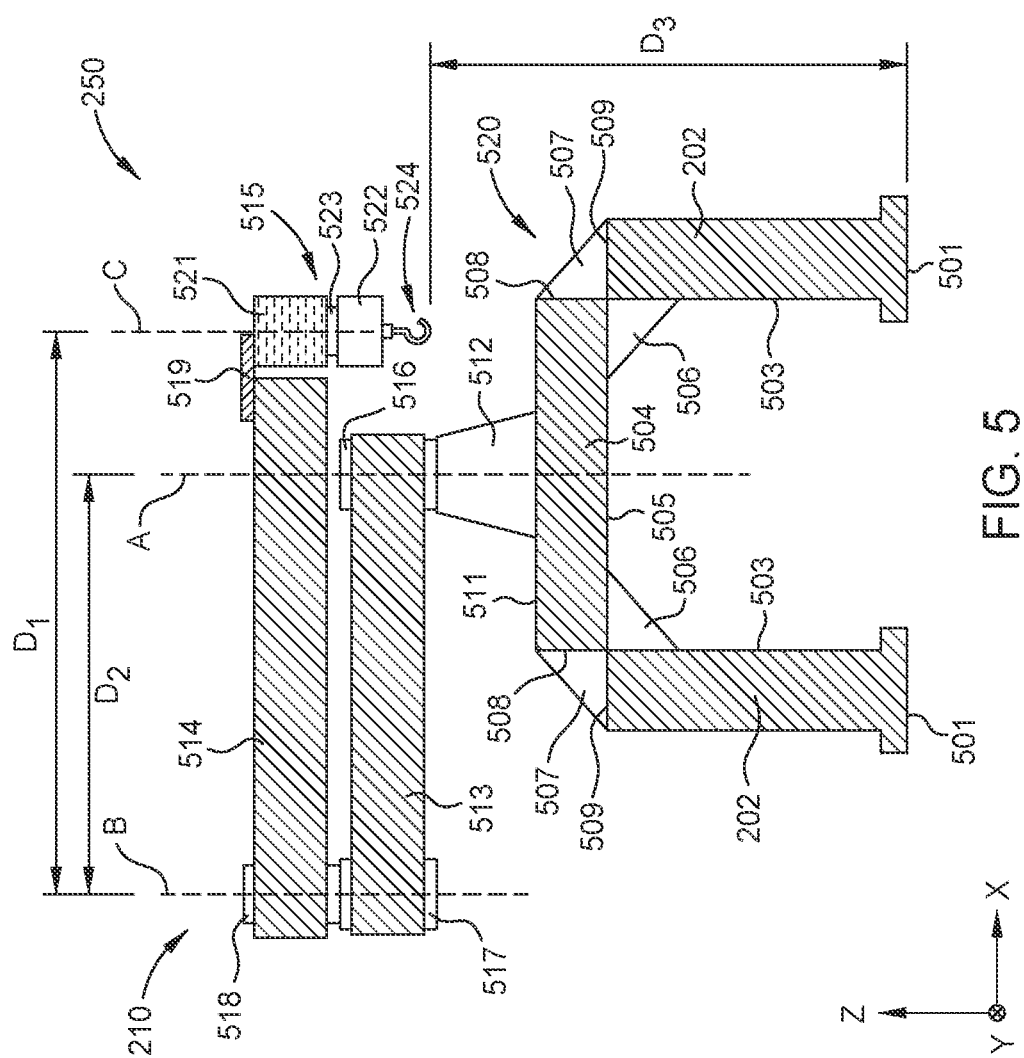
FIG. 5 is a schematic side view of the lift assembly of FIG. 2, according to one or more embodiments.

FIG. 5 is a schematic side view of the lift assembly 250 of FIG. 2, according to one or more embodiments. The lift assembly 250 includes a base assembly 520 and an arm assembly 210. The arm assembly 210 is disposed on top of the base assembly 520, such that the base assembly 520 supports the arm assembly 210 and couples the arm assembly 210 to the upper support element 201 (FIG. 2) of the processing module 150.

The base assembly 520 includes two or more support legs 202. In the embodiments described herein, there are two support legs 202. The support legs 202 are configured to be coupled to the upper support element 201 of the processing module 150 at a coupling base 501. The coupling base 501 includes a mounting plate that is a portion of the support legs 202 wider than the upper portion of the support legs 202. The coupling base 501 is coupled to the upper support element 201 by use of fastener openings formed therein and one or more fasteners, such as a bolt or a screw. A support bar 504 is disposed between and couples the two or more support legs 202 together. In embodiments in which there are two support legs 202, the support bar 504 is a single bar disposed between the two support legs 202. In some embodiments, the length of the support bar 504 extending along a major axis of the support bar 504 is less than the distance between the inner surface of a first support leg 202 and the inner surface of a second support leg 202.

The support bar 504 is coupled to the support legs 202 by a plurality of first brackets 506, a plurality of second brackets 507, or a combination of first and second brackets 506, 507. The support bar 504 includes opposite ends which are each coupled to one of the support legs 202. In the embodiment disclosed in FIG. 5, the plurality of first brackets 506 includes two first brackets 506 and the plurality of second brackets 507 includes two second brackets 507. Each of the first brackets 506 connect the support bar 504 to one of the support legs 202. The first brackets 506 contact the bottom surface 505 of the support bar 504 and the inner surface 503 of the support legs 202. One of the first brackets 506 couples each of the support legs 202 to the support bar 504. The first brackets 506 assist in providing support to the support bar 504 and maintain the support bar 504 in a raised position.

Each of the second brackets 507 additionally connect the support bar 504 to one of the support legs 202. The second brackets 507 contact the outer surface 508, sometimes referred to as the side surface, of the support bar 504 and the top surface 509 of the support legs 202. The top surface 509 is on the distal end of the support legs 202 from the coupling base 501. One of the second brackets 507 couples each of the support legs 202 to the support bar 504. The second brackets 507 assist in providing support to the support bar 504 and maintain the support bar 504 in a raised position, while additionally preventing rotation of the support bar 504 when the arm assembly is moved.

The arm assembly 210 includes a first actuator 512 coupled to a top surface 511 of the support bar 504, a first actuator shaft 516 coupling a first end of a first arm 513 to the first actuator 512, a second actuator 517, a second actuator shaft 518 coupling a first end of a second arm 514 to a second end of the first arm 513 opposite the first end of the first arm 513, and a lift actuator 515 is coupled to the second arm 514. A lift clasp 524 is coupled to the lift actuator 515.

In some embodiments, the first actuator 512 and the first actuator shaft 516 are disposed in the center of the support bar 504. In some embodiments, the support bar 504 is reinforced near the location of the first actuator 512. The first actuator 512 is connected to the support bar 504 using one or more connectors. The connectors may include bolts, screws, or clamps. The first arm 513 is coupled to the first actuator 512 at a distal end by the first actuator shaft 516, such that the first actuator shaft 516 is disposed through the first arm 513. The first actuator 512 is configured to rotate the first arm 513 about a first axis A. The first axis A is a vertical axis and may be described as a first actuator rotation axis.

The second arm 514 is coupled to the first arm 513 at a second actuator 517. The second actuator 517 is coupled to a second end of the first arm 513 distal from the first end of the first arm 513, first actuator 512, and the first actuator shaft 516. In some embodiments, as shown in FIG. 5, the second actuator 517 is disposed through the first arm 513, while the second actuator shaft 518 is coupled to the second arm 514 at a distal first end of the second arm 514. The second actuator 517 is configured to rotate the second arm 514 about a second axis B and may be described as a second actuator rotation axis. The second axis B extends through the second actuator 517 and is parallel to the first axis A. The rotation of the first arm 513 about the first axis A and the second arm 514 about the second axis B allows the arm assembly 210 to move above each of the process stations 160A-160F (FIGS. 1-2). The two arm structure additionally enables the arm assembly 210 to extend outward from the outer edges of the processing module 150 (FIG. 2) and place or pick up portions of the process stations 160A-160F from the maintenance table 230. The lift actuator 515 is coupled to a distal end of the second arm 514 from the second actuator 517 and the second actuator shaft 518. Each of the first actuator 512 and the second actuator 517 are rotational actuators and are configured to separately rotate the first arm 513 and the second arm 514 about the first axis A and the second axis B based on commands from a system controller 199. In some embodiments, the relative rotation of the shafts of the first actuator 512 and the second actuator 517 are coordinated by elements within the system controller 199. The coordinated rotation of the shafts of the first actuator 512 and the second actuator 517 can be used to create a desired constant or an adjustable variable "gear ratio" to allow for a desired relative rotation to be achieved about the first axis A and the second axis B as the first arm and second are extended and retracted from one position to another.

In an alternate embodiment, the first actuator 512 includes in input gear (not shown) and the second actuator 517 is replaced with fixed output gear (not shown), which is coupled to the second actuator shaft 518 and coupled to the input gear by a belt (not shown). In this configuration, the rotation of the first actuator shaft of the first actuator 512 causes a direct rotation of the second gear and second actuator shaft 518 which is used to allow for a desired relative rotation to be achieved about the first axis A and the second axis B (i.e., fixed gear ratio) as the first arm and second are extended and retracted from one position to another.

A lift coupling member 519 couples the lift actuator 515 to the second arm 514. The lift coupling member 519 may include an upper portion 521, a bellows assembly 523, and a lower portion 522. The bellows assembly 523 is disposed between the upper portion 521 and the lower portion 522. The bellows assembly 523 is coupled to the bottom surface of the upper portion 521 and the top surface of the lower portion 522. The bellows assembly 523 is configured to expand and contract to raise and lower the lower portion 522. The lower portion 522 includes the lift clasp 524 disposed on the bottom of the lower portion 522. The lower portion 522 is configured to support the lift clasp 524 and coupled the lift clasp 524 to the bellows assembly 523. The upper portion 521 couples the bellows assembly 523 to lift coupling member 519 and the second arm 514. The upper portion 521 may include an actuator for actuating the bellows assembly 523. The upper portion 521 is coupled to the bottom portion of the lift coupling member 519 and disposed downward towards the coupling base 501. A third axis C is disposed through the lift actuator 515. The third axis C extends along the direction in which the lift clasp 524 travels when the bellows assembly 523 expands or retracts. In some embodiments, the third axis C is parallel to both the first axis A and the second axis B. The third axis C intersects the lift clasp 524 at a location at which the corresponding cage clasp 418 would rest. The bellows assembly 523 expandable and includes one or more springs (not shown) as well as a winch line (not shown) encased in a sleeve, which is actuated upwards and downwards by the upper portion 521. The one or more springs assist in stabilizing the lower portion 522 while the lower portion 522 is actuated with the winch line. The bellows assembly 523 enables the lifting and lowering of the process stations 160A-160F, while reducing the swinging or tilting of the process stations 160A-160F. In some embodiments, a winch assembly may be used in place of the lift actuator 515, but it is believed the bellows assembly 523 provides greater comparative stability.

In embodiments described herein, the distance $D_1$ between the second axis B and the third axis C is greater than about 25 inches, such as about 25 inches to about 50 inches, such as about 30 inches to about 45 inches, such as about 32 inches to about 40 inches. The distance $D_2$ from the first axis A to the second axis B is greater than about 25 inches, such as about 25 inches to about 50 inches, such as about 30 inches to about 45 inches, such as about 43 inches to about 40 inches. The distance $D_1$ from the second axis B to the third axis C is greater than the distance $D_2$ from the first axis A to the second axis B. In some embodiments, the distance $D_1$ is about 1 inch to about 7 inches longer than the distance $D_2$, such as about 2 inches to about 4 inches longer than the distance $D_2$. The distance $D_1$ being greater than the distance $D_2$ allows for the lift actuator 515 to be positioned over each of the process stations 160A-160F while coupled to the processing module 150 and also being able to position the process stations 160A-160F onto a maintenance table, such as the maintenance table 230 of FIG. 2. If the distance $D_1$ is large, then the torque on the first actuator 512 is increased and the footprint of the assembly is increased. However, if the distance $D_2$ is not large enough, the process station 160A-160F is not able to be positioned onto the maintenance table 230. The first arm 513 has a first arm length less than a second arm length of the second arm 514. The bottom of the lift clasp 524 and the lift actuator 515 is a third distance $D_3$ from the coupling base 501. The third distance $D_3$ is about 10 inches to about 40 inches, such as about 12 inches to about 35 inches. The distance from the bottom of the lift clasp 524 to the upper module surface 211 is about 20 inches to about 48 inches, such as about 30 inches to about 42 inches. The distance can vary as the lift clasp 524 is raised and lowered.

The lift assembly 250 described herein beneficially enables portions of any of the process stations 160A-160F to be removed or placed into the processing module 150. The use of the support legs 202 and the support bar 504 to support the arm assembly reduces the overall weight and size of the lift assembly 250, while maintaining structural integrity of the lift assembly 250 as the arm assembly 210 is moved and extended. The support legs 202 allow the arm assembly 210 to extend over and raise portions of the process stations 160A-160F during various maintenance activities. Reducing the weight of the lift assembly 250 reduces deflection of the processing module 150 by the placement of the lift assembly 250 on the processing module 150. The placement of the lift assembly on the structural support assembly 205 further prevents deflection of the processing module 150 and distributes the load from the lift assembly 250 across multiple areas of the processing module 150. The lift assembly 250 may have a maximum load capacity rating of about 400 pounds, such as about 300 pounds in the direction parallel to the Z-axis and parallel to the third axis C.

Process Station Preventive Maintenance Preparation Examples

Figure 6A:
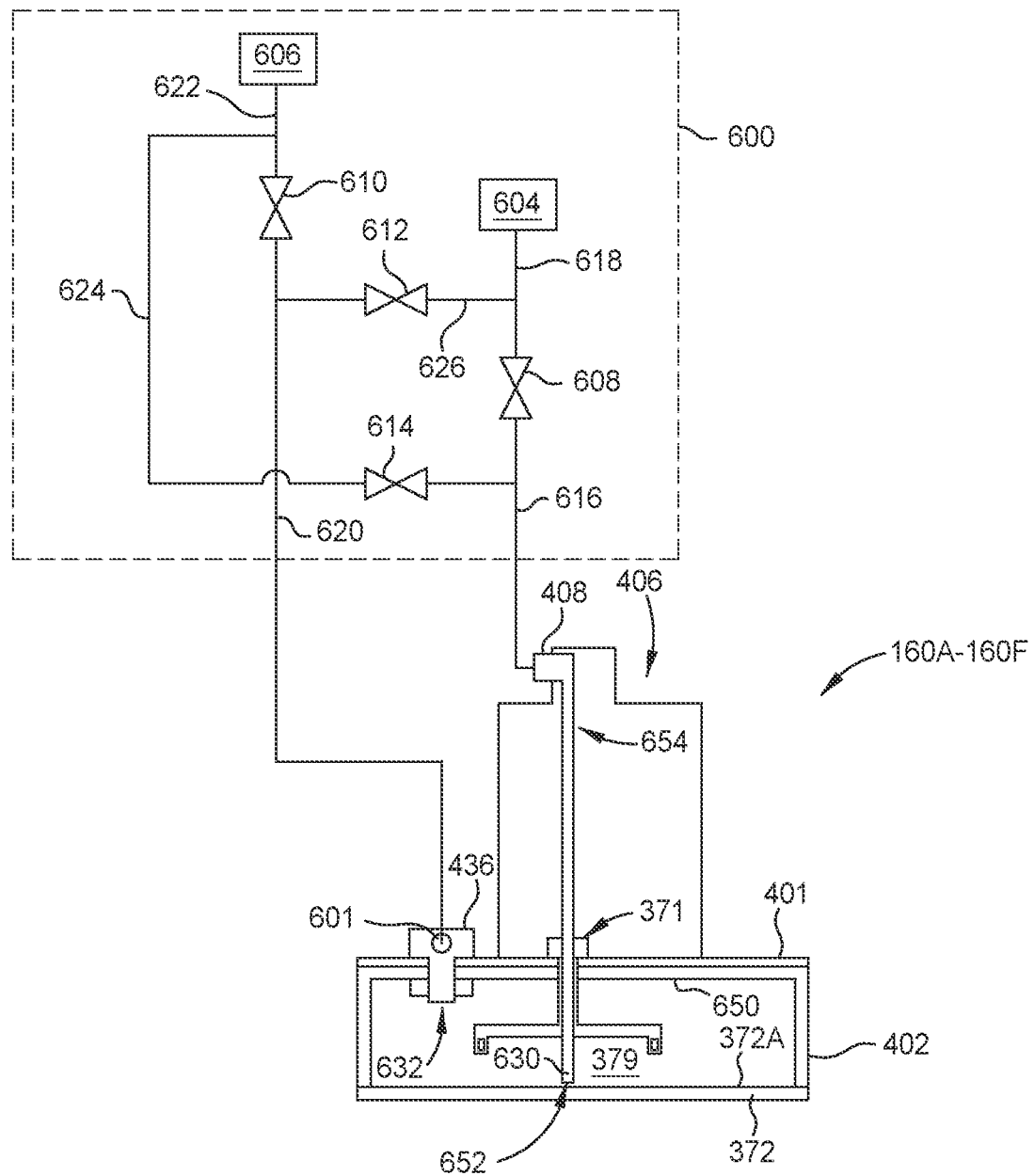
FIG. 6A a schematic cross-sectional view of an embodiment of a process station with a fluid delivery assembly, according to one or more embodiments.

FIG. 6A is a schematic cross-sectional view of an embodiment of one of the process stations 160A-160F with a fluid delivery assembly 600. The fluid delivery assembly 600 is configured to provide and remove cooling fluid from the magnetron region 379. The fluid delivery assembly 600 enables the cooling fluid to be supplied to the magnetron region 379 during substrate processing, while also providing apparatus for removing the cooling fluid before removing one of the process stations 160A-160F away from the processing module 150 (FIG. 2).

During substrate processing, the cooling fluid is delivered to the magnetron region 379 by a first fluid connection 408, which is fluidly coupled to a feed source 604, and removed from the magnetron region 379 through the first fluid connection 408 while fluidly coupled to a fluid pump 606. A corresponding fluid port 601 is coupled to the magnetron region 379 to remove fluid as fluid is supplied by the first fluid connection 408 and to supply gas while the fluid is removed from the magnetron region 379 through the first fluid connection 408. The magnetron region 379 is filled with the cooling fluid during processing and the cooling fluid is continuously circulated therethrough.

During maintenance activities, removing the cooling fluid from the magnetron region 379 includes the use of a third fluid connection 436 with a fluid port 601, as the third fluid connection 436 is configured to supply gas to the magnetron region 379, which blows out the magnetron region 379 as fluid is removed through a fluid delivery port 652 disposed through the magnetron assembly 371. The fluid delivery port 652 is fluidly coupled to the first fluid connection 408 and fluid is transferred to the fluid pump 606. During removal of the fluid, the use of the fluid port 601 to blow out the magnetron region 379 and a fluid outlet extension 630 enables nearly all of the cooling fluid from the magnetron region 379 to be removed before the portion of the process station 160A-160F is removed from the processing module 150. Removing the process fluid reduces the likelihood of spillage during lifting of the process station 160A-160F and reduces the weight of the process station 160A-160F. The fluid outlet extension 630 extends a fluid delivery port 652 to be adjacent to a top surface 372A of a target 372. In some embodiments, the fluid outlet extension 630 positions the fluid delivery port 652 to be less than 5 mm from the top surface 372A, such as less than 3 mm from the top surface 372A, such as less than 1 mm from the top surface 372A.

The fluid delivery assembly 600 is attached to the first fluid connection 408 and third fluid connection 436. The third fluid connection 436 includes a fluid port 601, which is configured to be coupled to one or more fluid conduits, which either removes cooling fluid/gas during filling of the magnetron region 379 or supplies gas for blowing out the magnetron region 379. The cooling fluid/gas is supplied and removed via a feed source 604 and a fluid pump 606 respectively using the one or more fluid conduits. As illustrated in FIG. 6A, the fluid delivery assembly 600 includes a feed source 604 and a fluid pump 606. The feed source 604 is configured to supply a fluid, such as deionized water, or a gas, such as an inert gas or air, to the magnetron region 379. The fluid pump 606 is configured to remove a fluid or gas from the magnetron region 379. In some embodiments, the feed source 604 and the fluid pump 606 are connected to allow recirculation of fluid through the magnetron region 379 during processing. The feed source 604 is fluidly coupled to the first fluid connection 408 of the station process component tower 406 by a first conduit 618 and a second conduit 616. A first valve 608 is disposed between and attaches the first conduit 618 and the second conduit 616. The first valve 608 may be opened or closed to allow fluid to pass therethrough or re-rout or halt fluid or gas flow from the feed source 604. The second conduit 616 is connected to the first fluid connection 408 by one or more connectors, such as a no-fluid leak type of connector. Utilizing no-fluid leak connectors enables the process stations 160A-160F to be coupled and decoupled from the processing module 150 without accidental leakage of a fluid, such as water into the processing region 360 or the transfer region 310, which will be exposed to a vacuum condition during substrate processing activities.

After the initial step of placing a process station 160A-160F onto the processing module 150 and during substrate processing, a second valve 612 and a fourth valve 614 are closed, while a first valve 608 and a third valve 610 are open. The second valve 612 and the fourth valve 614 being closed while the first valve 608 and the third valve 610 are open allows a fluid, such as deionized water, to be delivered to the first fluid connection 408 and subsequently the magnetron region 379, while gas/air or water which was present in the magnetron region 379 is removed by the fluid pump 606 through the fluid port 601. After placement of the process station 160A-160F onto the processing module 150, the magnetron region 379 is refilled with a cooling fluid and gas/air which is present in the magnetron region 379 is removed. Once the gas/air is removed and the cooling fluid has filled the magnetron region 379, the fluid pump 606 assists in circulating the cooling fluid by removing the cooling fluid from the magnetron region 379 via the fluid port 601 and supplying the cooling fluid to the magnetron region 379 via the first fluid connection 408, which supplies fluid to a fluid supply conduit 654. The fluid supply conduit 654 is a conduit disposed between the first fluid connection 408 and a fluid delivery port 652 disposed through the bottom of the magnetron assembly 371. The fluid supply conduit 654 is disposed through the magnetron assembly 371 to enable fluid supply in the center of the magnetron region 379 and above the center of the target 372. A fluid inlet 632 is at the bottom of the third fluid connection 436 (FIGS. 6A-6B) and in fluid communication with the magnetron region 379. In some embodiments, the removal of gas/air is passive and does not utilize the fluid pump 606 when the feed source includes a positive displacement pump for displacing cooling fluid from the feed source 604 to the fluid delivery port 652. The fluid pump 606 can be a suction pump and may be used in addition to or alternatively with the positive displacement pump of the feed source 604. In embodiments, which utilize the fluid pump 606 to pump the gas along with the fluid, an appropriate pump, such as a diaphragm pump may be utilized as a diaphragm pump may run dry without damaging the fluid pump 606.

When the second valve 612 and the fourth valve 614 are open, but the first valve 608 and the third valve 610 are closed, fluid is evacuated from the magnetron region 379. Evacuating the fluid from the magnetron region 379 includes supplying gas via the third fluid connection 436 to the magnetron region 379 from the feed source 604. The gas is an inert gas or air. Supplying the inert gas or air to the magnetron region 379 blows out the magnetron region 379 before removal of one of the process stations 160A-160F from the processing module 150. The fluid is removed through the fluid delivery port 652 and the first fluid connection 408. The fluid removed via the fluid delivery port 652 and the first fluid connection 408 is removed to the fluid pump 606.

The feed source 604 is coupled to the fluid port 601 of the third fluid connection 436 by the first conduit 618, a third conduit 626, and a fourth conduit 620. The third conduit 626 is coupled to the first conduit 618 between the feed source 604 and the first valve 608, such that the third conduit 626 is an offshoot of the first conduit 618. The second valve 612 connects the third conduit 626 and the fourth conduit 620. The second valve 612 is configured to be in an opened or closed position to allow fluid or gas to pass therethrough. When the second valve 612 is in an open position, fluid or gas may flow between the first conduit 618 and the fourth conduit 620 via the third conduit 626. When the second valve 612 is in a closed position, fluid is prevented from flowing between the first conduit 618 and the fourth conduit 620 via the third conduit 626.

The fluid pump 606 is connected to a fifth conduit 622. The fluid pump 606 is fluidly coupled to the fluid port 601 of the third fluid connection 436 by the fifth conduit 622, and the fourth conduit 620. The fifth conduit 622 is coupled to the fourth conduit 620 by the third valve 610. The third valve 610 is similar to the first valve 608 and the second valve 612 in that the third valve 610 is configured to be either open or closed. When the third valve 610 is open, the fifth conduit 622 is in fluid communication with the fourth conduit 620, such that fluid or gas may flow from the fluid port 601 of the third fluid connection 436 to the fluid pump 606 via the fourth conduit 620 and the fifth conduit 622. When the third valve 610 is closed, the fifth conduit 622 is not in fluid communication with the fourth conduit 620 and fluid does not travel from the fluid port 601 of the third fluid connection 436 to the fluid pump 606. The fluid pump 606 is fluidly coupled to the fluid port 601 via the fifth conduit 622, a sixth conduit 624, and the second conduit 616. The sixth conduit 624 is coupled to the fifth conduit 622 between the fluid pump 606 and the third valve 610. The sixth conduit 624 is coupled to the second conduit 616 by a fourth valve 614. The fourth valve 614 may be opened or closed in a similar fashion to the first valve 608, the second valve 612, and the third valve 610. When the fourth valve 614 is in an open position, the fluid pump 606 is fluidly coupled to the first fluid connection 408 as fluid may flow from the second conduit 616 to the sixth conduit 624 through the fourth valve 614.

Figure 6B:
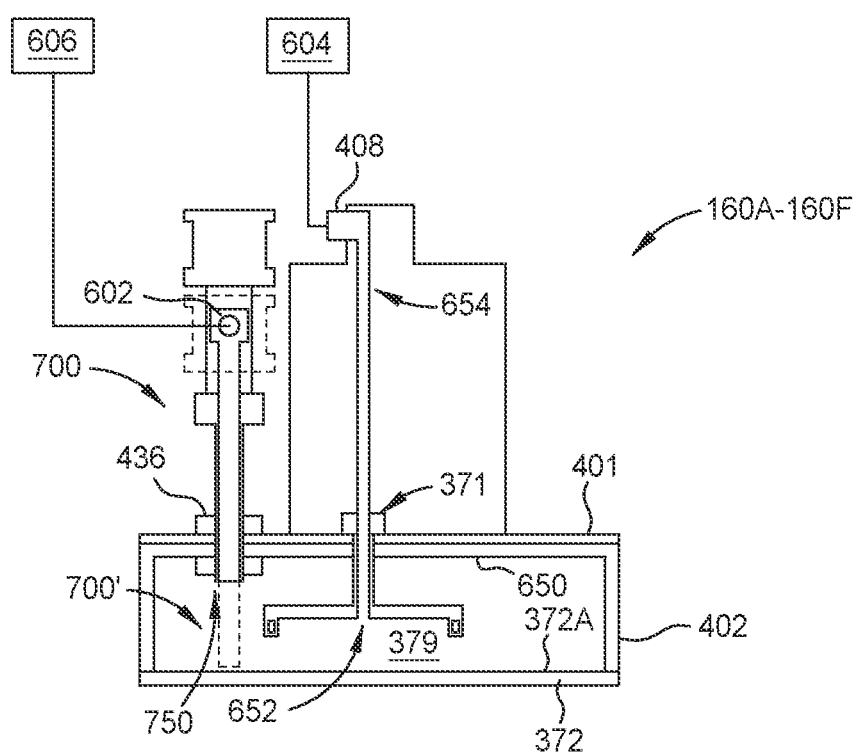
FIG. 6B is a schematic cross-sectional view of another embodiment of a process station with a fluid delivery assembly, according to another embodiment.

FIG. 6B is a schematic cross-sectional view of an embodiment of one of the process stations 160A-160F with a fluid return column 700. The embodiment of FIG. 6B is similar to the embodiment of FIG. 6A, but includes the fluid return column 700 coupled to the third fluid connection 436, does not include the fluid outlet extension 630, and includes a simplified conduit and fluid pump 606 and feed source 604 assembly. The fluid return column 700 is configured to remove cooling fluid and gas from the magnetron region 379. The fluid return column 700 and the fluid delivery port 652 enable the cooling fluid to be supplied to the magnetron region 379 during substrate processing, while also providing apparatus for removing the cooling fluid before removing a portion of a process station from the processing module 150 (FIG. 2). The conduit and valve assembly of the embodiment of FIG. 6B is simplified when compared to the embodiment of FIG. 6A. The simplified conduit and valve assembly is enabled by the utilization of the fluid return column 700 as described below.

The fluid return column 700 includes the fluid outlet port 602 and a fluid inlet port 750. As shown in FIG. 6B, the fluid return column 700 is configured to be lowered to a fluid removal position 700' and the fluid inlet port 750 is configured to be adjacent to the top surface 372A of the target 372. In some embodiments, the fluid inlet port 750 is positioned less than 5 mm from the top surface 372A, such as less than 3 mm from the top surface 372A, such as less than 1 mm from the top surface 372A. The fluid return column 700 is disposed partially through the third fluid connection 436. The fluid outlet port 602 of the fluid return column 700 is fluidly coupled to a fluid pump 606 via a conduit. The first fluid connection 408 is fluidly coupled to a feed source 604 via a conduit. The feed source 604 is configured to flow a fluid, such as a gas or a liquid, into the magnetron region 379 via the first fluid connection 408 and the fluid delivery port 652. The fluid pump 606 is configured to remove a fluid, such as a gas or a liquid, from the magnetron region 379.

The fluid return column 700 enables both the liquid and the gas to be supplied through the fluid delivery port 652, while both the liquid and the gas are removed via the fluid return column 700. After initial placement of one of the process stations 160A-160F, liquid is introduced into the magnetron region 379 through the fluid delivery port 652 to fill the magnetron region 379. The gas initially present in the process stations 160A-160F is removed via the fluid return column 700. The fluid return column 700 is in a raised position while removing the gas from the magnetron region 379.

After a portion of a process station has been positioned on the processing module 150 and the magnetron region 379 is filled with a liquid, the liquid is circulated during substrate processing operations. Circulating the liquid includes introducing fluid via the fluid delivery port 652 and removing the fluid via the fluid inlet port 750 of the fluid return column 700. The fluid return column 700 is in a raised position while circulating the liquid within the magnetron region 379 to enable an increased fluid turnover rate. The fluid return column 700 being in a raised position during circulation of the liquid additionally prevents the fluid return column 700 from interfering with the rotation of the magnetron 379 about a central axis. The magnetron assembly 371 is rotated to improve film formation uniformity. Although not illustrated as such herein, the magnetron assembly 371 may extend radially outward of the location of the fluid return column 700. The magnetron assembly 371 extending radially outward of the fluid return column 700 allows the magnetic field created by the magnetron assembly 371 to extend beyond the outer edges of a substrate disposed within one of the processing stations 160A-160F. The arms of the magnetron assembly 371 are offset from (i.e. at a different radial coordinate from) the inlet port 750 of the fluid return column 700 while in the fluid removal position 700' in order to prevent the fluid return column 700 from contacting the fluid removal position 700'.

When the process stations 160A-160F are ready to be removed for maintenance or replacement, the magnetron regions 379 within a process station is evacuated to remove liquid therefrom. The liquid is removed to reduce the weight of the portion of the process station that is to be removed and to reduce the odds of liquid spilling onto other components during transfer. Removing the liquid includes stopping the flow of liquid from the feed source 604. The inlet port 750 of the fluid return column 700 is lowered through a hole within the top surface 401 of the outer source assembly casing 402 of the magnetron region 379. The inlet port 750 is lowered to a liquid removal position after the flow of liquid from the feed source 604 is stopped. The lowering of the fluid return column 700 brings the fluid return column 700 to a fluid removal position 700' in close proximity to the top surface 372A of the target 372. After the lowering of the fluid return column 700, the feed source 604 is configured to supply a gas, such as air or an inert gas to the magnetron region 379. The lowered fluid return column 700 removed the fluid from the magnetron region 379 until the magnetron region 379 is filled with a gas. The gas supplied through the fluid delivery port 652 may be a high pressure gas stream to blow out the magnetron region 379 and remove liquid from the surface of the target 372.

Figure 7A:
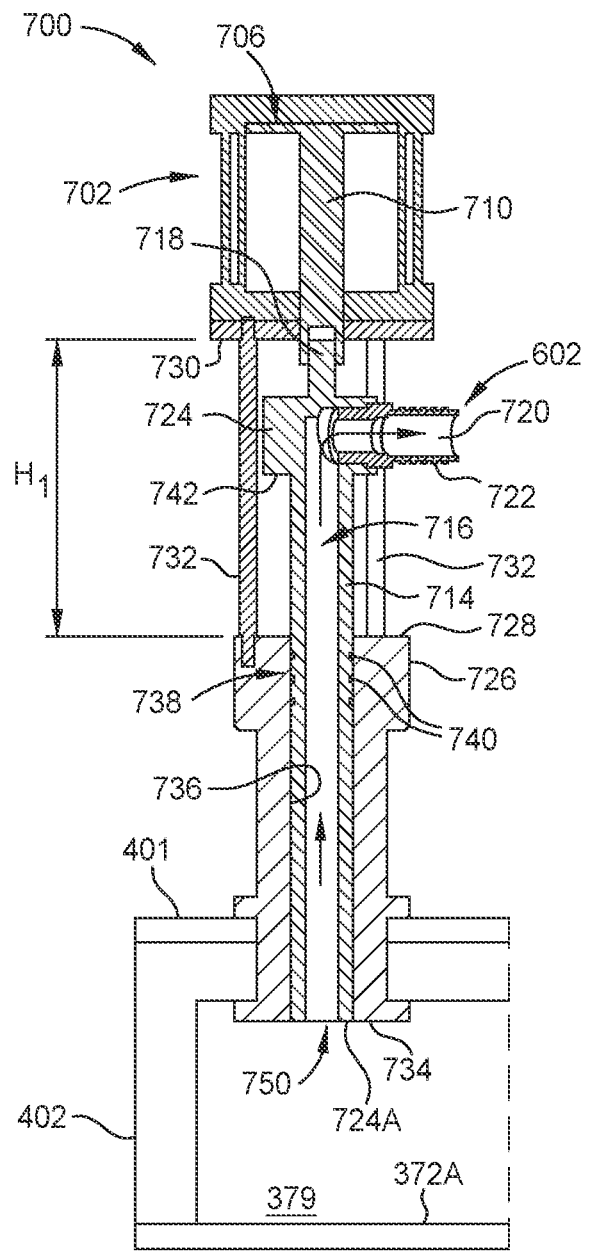
FIGS. 7A and 7B are schematic cross-sectional views of the fluid delivery assembly of FIG. 6B, according to one or more embodiments.
Figure 7B:
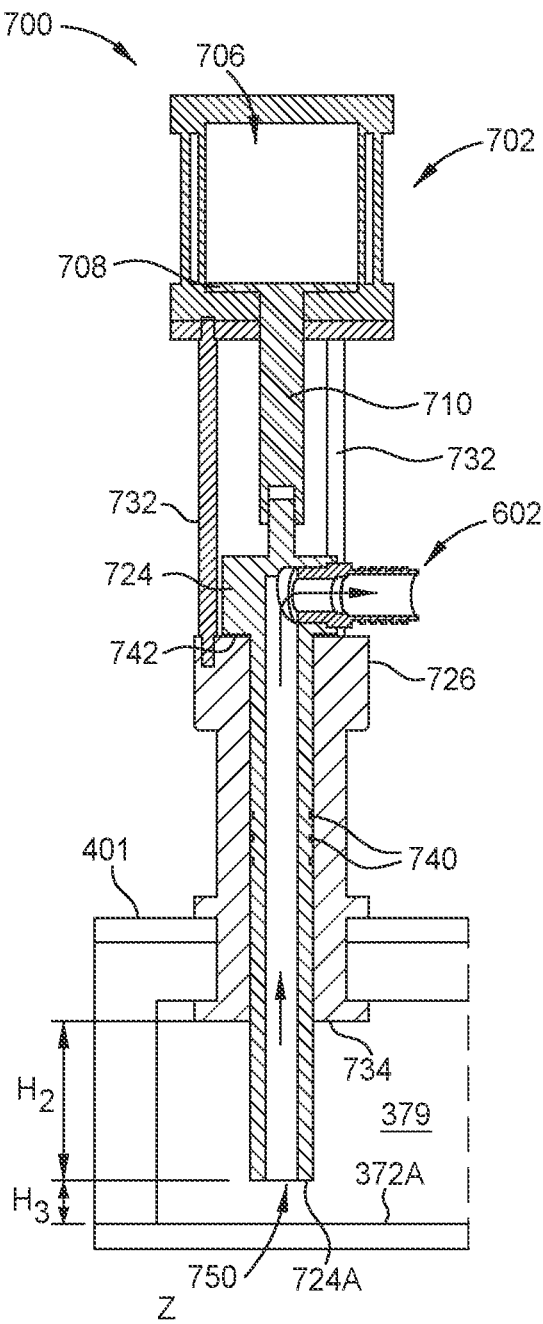

FIGS. 7A and 7B are schematic side views of the fluid return column 700 of FIG. 6B, which is positioned on the top surface 401 of the outer source assembly casing 402. The fluid return column 700 includes a fluid delivery pipe 724, an actuator 702, a plunger 710 coupling the fluid delivery pipe 724 to the actuator 702, a mounting column 726 disposed around a portion of the fluid delivery pipe 724, and two or more rods 732 disposed outside of the fluid delivery pipe 724 and between the actuator 702 and the mounting column 726. In some embodiments, the actuator 702 is a pneumatic actuator that includes a plunger 710. During maintenance activities, as will be discussed further below, the fluid delivery pipe 724 of the fluid return column 700 can be positioned by the actuator 702 so that the lower end 724A of the fluid delivery pipe 724 is in a desired position relative to one or more components of the source assembly 370, such as the target 372.

FIG. 7A illustrates the fluid delivery pipe 724 and the actuator 702 in a raised position. The raised position is utilized while fluid is being supplied to the magnetron region 379 (FIG. 6B). While fluid is being supplied to the magnetron region 379, residual gas and fluid is removed from the magnetron region 379 via the fluid pump 606, the third valve 610, the fourth conduit 620, the fluid outlet port 602, and the fluid inlet port 750. Fluid is removed via a fluid inlet port 750 disposed within the lower section of the source assembly 370 to a central channel 716 of the fluid delivery pipe 724, through the fluid outlet 720 and out the fluid outlet port 602. The lower end 724A of the fluid delivery pipe 724 may be flush with the bottom surface 734 of the mounting column 726 while in the raised position. The fluid inlet port 750 is disposed through the lower end 714A of the fluid delivery pipe 724. The plunger 710 of the actuator 702 is used to cause the fluid delivery pipe 724 to be positioned in the raised position, by causing the plunger 710 to be positioned at a first position (FIG. 7A) within the plunger volume 706, or positioned in the lowered position, by causing the plunger 710 to be positioned at a second position (FIG. 7B) by use of pneumatic means.

FIG. 7B illustrates the fluid delivery pipe 724 in a lowered position. During maintenance activities, the lowered position is utilized while fluid is being drained from the magnetron region 379. Liquid is removed from the magnetron region 379 via the fluid delivery pipe 724 during draining operations. The liquid removed from the magnetron region 379 flows into the fluid inlet port 750, through the fluid delivery pipe 724, out of the fluid outlet 720 and the fluid outlet port 602. The lower end 724A of the fluid delivery pipe 724 may be offset from the bottom surface 734 of the mounting column 726 while in the lowered position, such that the lower end 724A of the fluid delivery pipe 724 is disposed adjacent the top surface 372A of the target 372 (FIG. 6B). The bottom of the fluid inlet port 750 is offset from the bottom surface 734 by a second height $H_2$. The second height $H_2$ is about 2 inches to about 5 inches, such as about 3 inches to about 4 inches, such as about 3.5 inches. The second height $H_2$ may be a similar height as the height of the vertical dimension of the magnetron region 379, such that when the fluid delivery pipe 724 is in the lowered position, fluid may be easily removed from the bottom of the magnetron region 379. The fluid delivery pipe 724 is lowered to be proximate the bottom of the magnetron region 379 either before or during fluid removal from the magnetron region 379. In some embodiments, the gap $H_3$ between the lower end 724A of the fluid delivery pipe 724 and the top surface 372A of the target 372 is between about 1 mm and about 5 mm.

The fluid delivery pipe 724 includes the fluid outlet port 602. The fluid outlet port 602 includes a fluid outlet 720 disposed on a first end of the fluid delivery pipe 724. The fluid outlet 720 includes a coupling region 722 for coupling the fluid delivery pipe 724 to a conduit. The central channel 716 is disposed through the fluid delivery pipe 724 and connects the fluid outlet 720 and a fluid inlet port 750 on the opposite side of the fluid delivery pipe 724 from the fluid outlet 720.

The central channel 716 is vertically disposed through the body 714 of the fluid delivery pipe 724. The body 714 of the fluid delivery pipe 724 forms the length of the fluid delivery pipe 724. A portion of the body 714 is disposed within the mounting column 726, and includes a sealing assembly 738 disposed therein. The sealing assembly 738 is disposed on the outside of the body 714 and forms a seal between the body 714 of the fluid delivery pipe 724 and the mounting column 726. The sealing assembly 738 can include one or more o-rings 740, as shown in FIGS. 7A-7B. The protrusion 718 is disposed on the opposite side of the head 742 from the body 714 of the fluid delivery pipe 724 and is used coupled to a portion of the actuator 702, such that the protrusion 718 is coupled to the plunger 710.

The mounting column 726 is a hollow column configured to be coupled to the top surface 401 of the outer source assembly casing 402. The mounting column 726 includes an inner surface 736, a bottom surface 734, and a top surface 728. The inner surface 736 of the mounting column 726 forms a channel from the bottom surface 734 to the top surface 728 of the mounting column 726, in which the body 714 of the fluid delivery pipe 724 is disposed. The mounting column 726 is disposed through a top wall 650 (FIG. 6B) of the magnetron region 379, such that the bottom surface 734 is disposed below the top wall 650 and inside of the magnetron region 379. The top surface 728 of the mounting column 726 is configured to receive each of the rods 732 and to support the head 742 of the fluid delivery pipe 724. Each of the rods 732 is separate and couples the mounting column 726 and the actuator 702 at a pre-set height $H_1$. The first height $H_1$ is about 4 inches to about 7 inches, such as about 5 inches to about 6 inches. The first height $H_1$ is large enough to provide space for full actuation of the plunger 710. Separating the mounting column 726 and the actuator 702 by a pre-set distance prevents overextending of the fluid delivery pipe 724 and enables repeatable movement of the fluid delivery pipe 724 by the actuator 702. Disposing the actuator 702 above the mounting column 726 further enables for the force applied to the fluid delivery pipe 724 to be applied directly as a linear force without imparting a moment on the fluid delivery pipe 724.

Process Station Interconnection Assembly

Figure 8A:
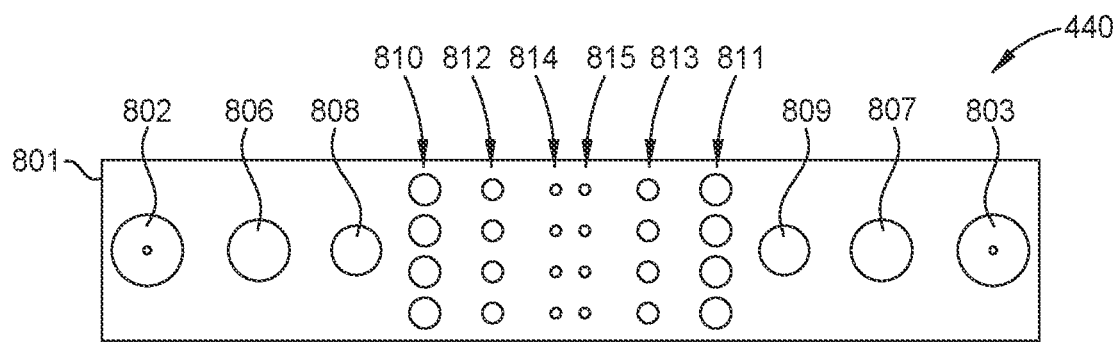
FIG. 8A is schematic plan view of a portion of a docking unit for use with one or more process stations, according to one or more embodiments.
Figure 8B:
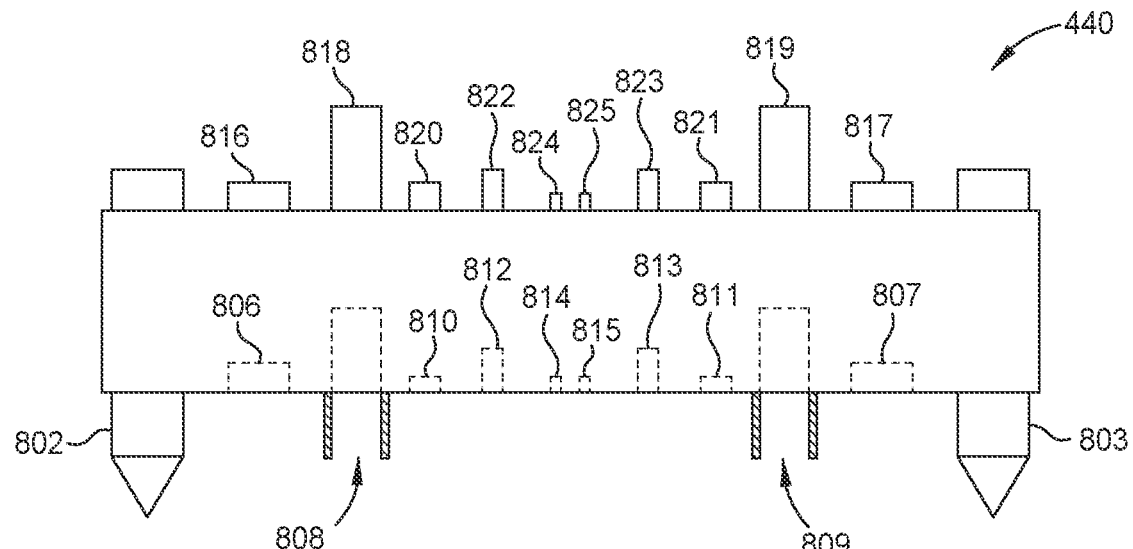
FIGS. 8B and 8C are schematic side views of mating portions of a docking unit for use with one or more process stations, according to one or more embodiments.
Figure 8C:
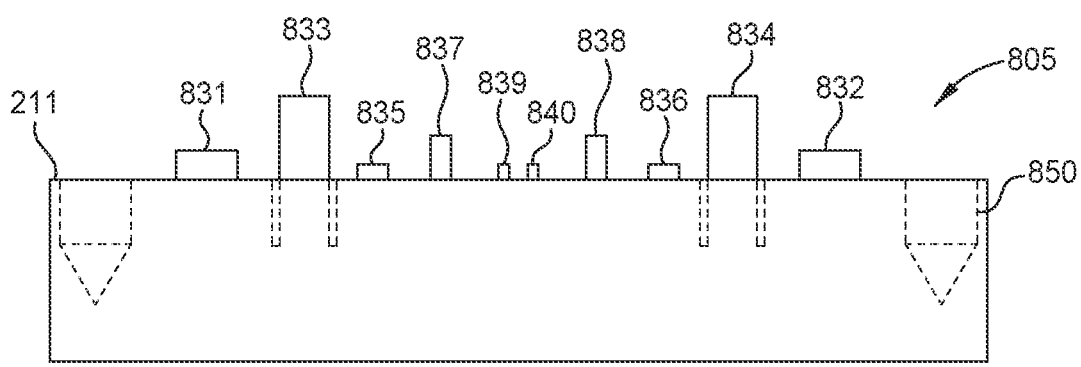

FIGS. 8A-8C are schematic views of a docking unit 440 for use with one or more process stations 160A-160F. The docking unit 440 of FIGS. 8A and 8B is configured to couple to a mating unit 805 as shown in FIG. 8C, to allow the quick, precise and repeatable connection of various electrical, pneumatic and fluid delivery elements utilized in a processing station 160 to various external components attached to the processing module 150 or positioned a distance from the processing system 100. The mated docking unit 440 and mating unit 805 are illustrated in FIGS. 4A and 4B, wherein the docking unit 440 is coupled to the mating unit 805 disposed on the upper module surface 211 of the processing module 150. In some embodiments, the docking unit 440 is connected to portions of the process station 160 and is coupled to a surface of the outer source assembly casing 402. In some embodiments, the docking unit 440 is attached to the side of the outer source assembly casing 402 as shown in FIGS. 4A and 4B. FIG. 8A is a bottom plan view of the docking unit 440. All of the fluid, gas, and electrical connections of a process stations 160 may be disposed within the docking unit 440, such that the coupling and decoupling of all of the fluid, gas, and electrical connections utilized in the processing station 160 are simultaneously made or removed by lowering and raising of the portion of the process stations 160A-160F using the lift assembly 250. In some embodiments, each of the fluid connections is a no-leak type of fluid connection, such as a CPC dripless connector available from Colder Products Company of North America, to prevent fluid leakage onto the other portions of the docking unit 440 and the mating unit 805 and short circuiting the electrical connections and/or contaminating the gas line connections. In some embodiments, there may be either less or more connections disposed within the docking unit 440 and the mating unit 805 than shown herein. Generally the docking unit 440 includes one or more water connections, one or more gas connections, and one or more electrical connections all disposed within a single body coupled to a portion of a process station 160A-160F.

As shown in FIG. 8A, the docking unit 440 includes one or more docking pins 802. The docking pins 802 are used to initially guide the docking unit 440 onto the mating unit 805 when the docking unit 440 is being lowered into position. As shown in FIG. 8A, there are two docking pins 802, 803, with one docking pin 802, 803 disposed on either distal end of the docking unit body 801. Each of the first docking pin 802 and the second docking pin 803 are configured to be inserted into guide holes 850. The guide holes 850 are sized to receive the first docking pin 802 and the second docking pin 803, such that the docking unit 440 is aligned with the mating unit 805 (FIG. 8C) in a uniform and repeatable fashion. The mating unit 805 is disposed within the upper module surface 211.

The docking unit 440 includes a variety of upper docking connections 806, 807, 808, 809, 810, 811, 812, 813, 814, 815. Each of the upper docking connections 806, 807, 808, 809, 810, 811, 812, 813, 814, 815 are meant to couple to one or more lower docking connections 831, 832, 833, 834, 835, 836, 837, 838, 839, 840 respectively (FIG. 8C). As shown in FIGS. 8B and 8C, the upper docking connections 806, 807, 808, 809, 810, 811, 812, 813, 814, 815 are female connection components while the lower docking connections 831, 832, 833, 834, 835, 836, 837, 838, 839, 840 are male connection components. In some embodiments, the opposite may be true and the upper docking connections 806, 807, 808, 809, 810, 811, 812, 813, 814, 815 are male connection components while the lower docking connections 831, 832, 833, 834, 835, 836, 837, 838, 839, 840 are female connection components. In some embodiments, the male and female connections are mixed. Docking connections 806 807 for fluid connections are disposed away from the docking connections 812, 813, 814, 815 for electrical connections to reduce the probability of fluid leaking onto the electrical connections. Docking connections 808, 809, 810, 811 for gas connections are disposed between the fluid connections and the electrical connections as a buffer and to reduce the footprint of the docking unit 440.

A first process station line connection 816 and a second process station line connection 817 are fluidly coupled to a first upper docking connection 806 and a second upper docking connection 807, respectively. The first upper docking connection 806 is configured to mate with a first lower docking connection 831 and the second upper docking connection 807 is configured to mate with a second lower docking connection 832. The first lower docking connection 831 and the second lower docking connection 832 may be coupled to a first gas supply line and a second gas supply line (not shown) to provide and remove gases from one of the process stations 160A-160F. A face seal or other type of sealing component (e.g., o-rings) may be placed at the interface between the mating unit 805 and the docking unit 440 to prevent leakage of a gas passing between the first upper docking connection 806 and the first lower docking connection 831, or the second upper docking connection 807 and the second lower docking connection 832, respectively. In some configurations, the first upper docking connection 806 and the first lower docking connection 831 combination, and the second upper docking connection 807 and the second lower docking connection 832 combination, are each separately isolated from each other and from other elements within the docking unit 440 and mating unit 805 when the mating unit 805 and the docking unit 440 are coupled together by use of a face seal or one or more sealing components.

A first fluid line and a second fluid line (not shown) may be coupled to the third process station line connection 818 and the fourth process station line connection 819, respectively. The third process station line connection 818 and the fourth process station line connection 819 are fluidly coupled to a third upper docking connection 808 and a fourth upper docking connection 809, respectively. The third upper docking connection 808 is configured to mate with a third lower docking connection 833 and the fourth upper docking connection 809 is configured to mate with a fourth lower docking connection 834. The third lower docking connection 833 and the fourth lower docking connection 834 may be coupled to a first fluid supply line and a second fluid supply line (not shown), such that when the docking unit 440 mates with the mating unit 805, the first fluid supply line and the second fluid supply line may provide fluid to the third process station line connection 818 and the fourth process station line connection 819. A face seal or other type of sealing component (e.g., O-ring(s)) may be placed at the interface between the mating unit 805 and the docking unit 440 to prevent a fluid from escaping from or encroaching into the third upper docking connection 808 and the third lower docking connection 833, or the fourth upper docking connection 809 and the fourth lower docking connection 834, respectively. In some configurations, the third upper docking connection 808 and the third lower docking connection 833 combination, and the fourth upper docking connection 809 and the fourth lower docking connection 834 combination, are each separately isolated from each other and from other elements within the docking unit 440 and mating unit 805 when the mating unit 805 and the docking unit 440 are coupled together by use of a face seal or one or more sealing components.

A third gas line and a fourth gas line (not shown) may be coupled to the fifth process station line connection 820 and the sixth process station line connection 821 respectively. The fifth process station line connection 820 and the sixth process station line connection 821 are fluidly coupled to a fifth upper docking connection 810 and a sixth upper docking connection 811 respectively. The fifth upper docking connection 810 is configured to mate with a fifth lower docking connection 835 and the sixth upper docking connection 811 is configured to mate with a sixth lower docking connection 836. The fifth lower docking connection 835 and the sixth lower docking connection 836 may be coupled to a third gas supply line and a fourth gas supply line (not shown). In a similar manner as discussed above, a face seal or other type of sealing component (e.g., O-ring(s)) may be placed at the interface between the mating unit 805 and the docking unit 440 to prevent leakage of a gas passing between the fifth upper docking connection 810 and the fifth lower docking connection 835, or the sixth upper docking connection 811 and the sixth lower docking connection 836, respectively. In some configurations, the fifth upper docking connection 810 and the fifth lower docking connection 835 combination, or the sixth upper docking connection 811 and the sixth lower docking connection 836 combination, are each separately isolated from each other, and from other elements within the docking unit 440 and mating unit 805, when the mating unit 805 and the docking unit 440 are coupled together by use of a face seal or one or more sealing components.

A first electric line and a second electric line (not shown) may be coupled to the seventh process station line connection 822 and the eighth process station line connection 823 respectively. The electrical connections within a seventh process station line connection 822 and the eighth process station line connection 823 are electrically coupled to the electrical connections within a seventh upper docking connection 812 and an eighth upper docking connection 813 respectively. The electrical connections within the seventh upper docking connection 812 are configured to mate with electrical connections within a seventh lower docking connection 837 and the electrical connections within the eighth upper docking connection 813 is configured to mate with electrical connections within a eighth lower docking connection 838. The seventh lower docking connection 837 and the eighth lower docking connection 838 may be coupled to a first electric supply line and a second electric supply line (not shown), such that when the docking unit 440 mates with the mating unit 805, the first electric supply line and the second electric supply line may provide power, such as RF or DC power, to one or more of the electrical connections within the seventh process station line connection 822 and/or the eighth process station line connection 823. A face seal, an insulator ring, or other type of sealing component (e.g., O-ring(s)) may be placed at the interface between the mating unit 805 and the docking unit 440 to isolate the electrical connections from the gas and fluid connections. The seal or insulating ring is used to isolate each of the seventh upper docking connections 812 and the seventh lower docking connections 837, or the eighth upper docking connection 813 and the eighth lower docking connection 838, respectively, from other elements within the docking unit 440 and mating unit 805, when the mating unit 805 and the docking unit 440 are coupled together.

A third electric line and a fourth electric line (not shown) may be coupled to the electrical connections within the ninth process station line connection 824 and the electrical connections within the tenth process station line connection 825 respectively. The low voltage DC or AC electrical connections within the ninth process station line connection 824 and the tenth process station line connection 825 are electrically coupled to the electrical connections within a ninth upper docking connection 814 and the electrical connections within a tenth upper docking connection 815 respectively. The ninth upper docking connection 814 is configured to mate with a ninth lower docking connection 839 and the tenth upper docking connection 815 is configured to mate with a tenth lower docking connection 840. The ninth lower docking connection 839 and the tenth lower docking connection 840 may be coupled to a third electric supply line and a fourth electric supply line (not shown) similar to the first electric supply line and the second electric supply line. A face seal, an insulator ring, or other type of sealing component (e.g., O-ring(s)) may be placed at the interface between the mating unit 805 and the docking unit 440 to isolate the electrical connections within the third and fourth electrical connections from the encroachment of a gas and/or fluid into these connections. The seal or insulating ring is used to isolate each of the electrical connections within the ninth upper docking connection 814 and the ninth lower docking connection 839, or the tenth upper docking connection 815 and the tenth lower docking connection 840, respectively, from other elements within the docking unit 440 and mating unit 805, when the mating unit 805 and the docking unit 440 are coupled together.

In some embodiments, each of the electrical connections are grouped together, each of the fluid connections are grouped together, and each of the gas connections are grouped together. The electrical connections, such as the seventh process station line connection 822, the eighth process station line connection 823, the ninth process station line connection 824, and the tenth process station line connection 825 are all grouped together. The electrical connections are physically separated from any of the fluid connections (e.g., liquid), such as the third process station line connection 818 and the fourth process station line connection 819, by at least one gas connection. The gas connections include the first process station line connection 816, the second process station line connection 817, the fifth process station line connection 820, and the sixth process station line connection 821. Although only the fifth process station line connection 820 and the sixth process station line connection 821 are disposed between the fluid connections and the electrical connections herein, in some embodiments the first process station line connection 816 and the second process station line connection 817 are also disposed inward of the fluid connections and between the fluid connections and the electrical connections.

Maintenance Activity Examples

Figure 9:
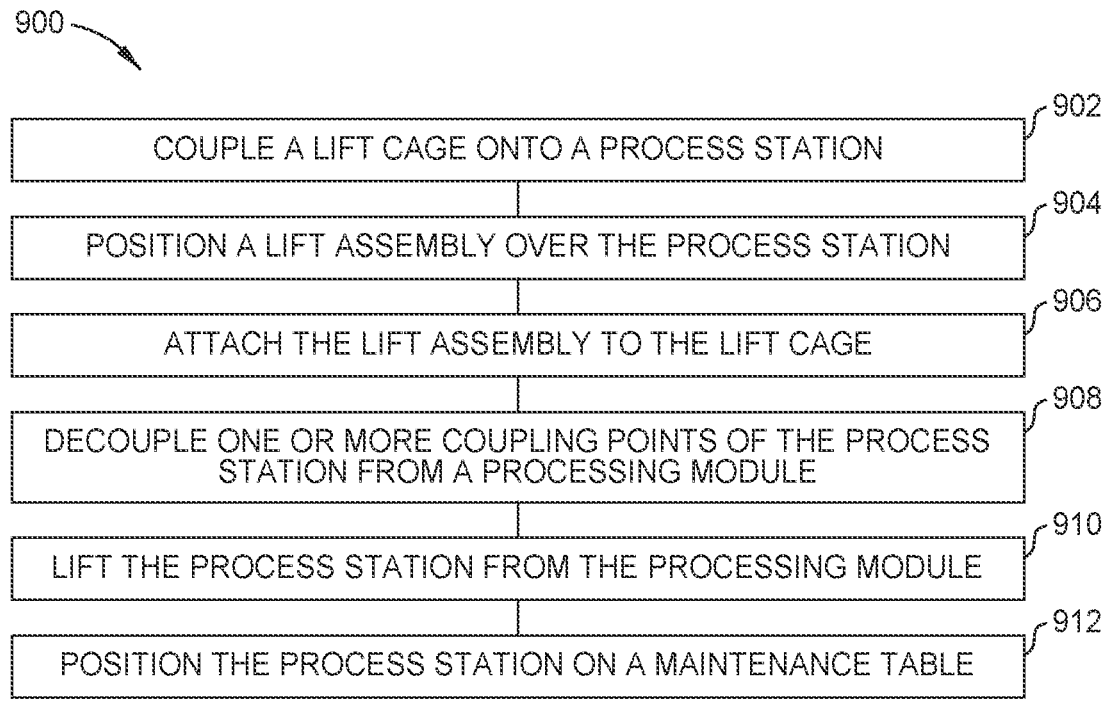
FIG. 9 is a method of removing a process station from a processing module, according to one or more embodiments.

FIG. 9 is a method 900 of removing a process station, such as one of the process stations 160A-160F, from the processing module 150, according to one or more embodiments. The method 900 utilizes apparatus similar to the lift assembly 250 described herein. The method 900 includes connecting a lift cage to the process station during a first operation 902. The lift cage may be similar to the lift cage 265. Connecting the lift cage onto the process station includes attaching the lift cage to a lift ring, such as the lift ring 410 which is connected to the process station. Using separate, but attachable lift cages and lift rings enables few number of lift cages to be utilized, while providing a repeatable apparatus for coupling the lift cage to the process station and distributes the force of the lifting of the process station. In some embodiments, one or more bolt connectors are utilized to attach the lift cage and the lift ring. In some embodiments, the lift cage may be permanently disposed on a portion of the process station 160 and the first operation 902 is optional. This embodiment may save significant manual labor, but utilizes a greater number of lift cages, which increases the total cost of the assembled apparatus. Therefore, separate, but attachable lift rings and lift cages are beneficial in that cost is reduced, while quick and secure attachment of the lift cage to the process station is possible.

After the first operation 902, a lift assembly, such as the lift assembly 250 is positioned over a process station 160 during a second operation 904. The arms of the lift assembly are actuated to be disposed over the desired process station and may be oriented, such that a lift clasp 524, of the lift assembly is disposed over a cage clasp 418 of the lift cage.

After the second operation 904, the lift assembly is attached to the lift cage during a third operation 906. Attaching the lift assembly to the lift cage includes coupling the lift clasp 524 and the cage clasp 418. Coupling the two clasps enables the lift assembly to apply force to the process station via the cage clasp.

After the third operation 906, the process station is decoupled from the processing module 150 by decoupling one or more coupling points, such as the coupling components 430, during a fourth operation 908. Decoupling the portion of the process station 160 from the processing module 150 enables lifting of the portion of the process station without lifting other components of the processing module. Decoupling of the process station may be performed automatically by disengaging coupling components. Before decoupling the processing module 150 and the process station 160, at least a processing region 360 of the process station 160 is vented to atmosphere. In some embodiments, the transfer region 310 is vented to atmosphere or filled with an inert gas simultaneously to the venting of the processing region 360 within the process station 160.

After the fourth operation 908, the process station is lifted from the processing module using the lift assembly 250 during a fifth operation 910. The lift assembly is used to lift the portion of the process station vertically from a resting position on the process module. The portion of the process stations are guided as they are lifted by guide posts, such as the guide posts 260. As the portion of the process station is lifted, the portion of the process station decouples from the processing module and a docking unit 440 decouples from a mating unit 805. After the portion of the process station is lifted clear of the guide posts, the portion of the process station may be moved in a horizontal direction, such that the portion of the processing station is moved radially outward from the outer edges of the processing module 150 and be positioned and support on the maintenance table 230.

After the fifth operation 910, the portion of the process station is positioned on a maintenance table, such as the maintenance table 230, during a sixth operation 912. Positioning the process station on the maintenance table allows for maintenance to be easily performed on the portion of the process station and any remaining portions of the process station 160 that is positioned on the processing module 150. After maintenance is performed on the portion of the process station, the process station may be returned to the processing position on the process module during a process similar to that proposed in the method 1000 of FIG. 10.

Figure 10:
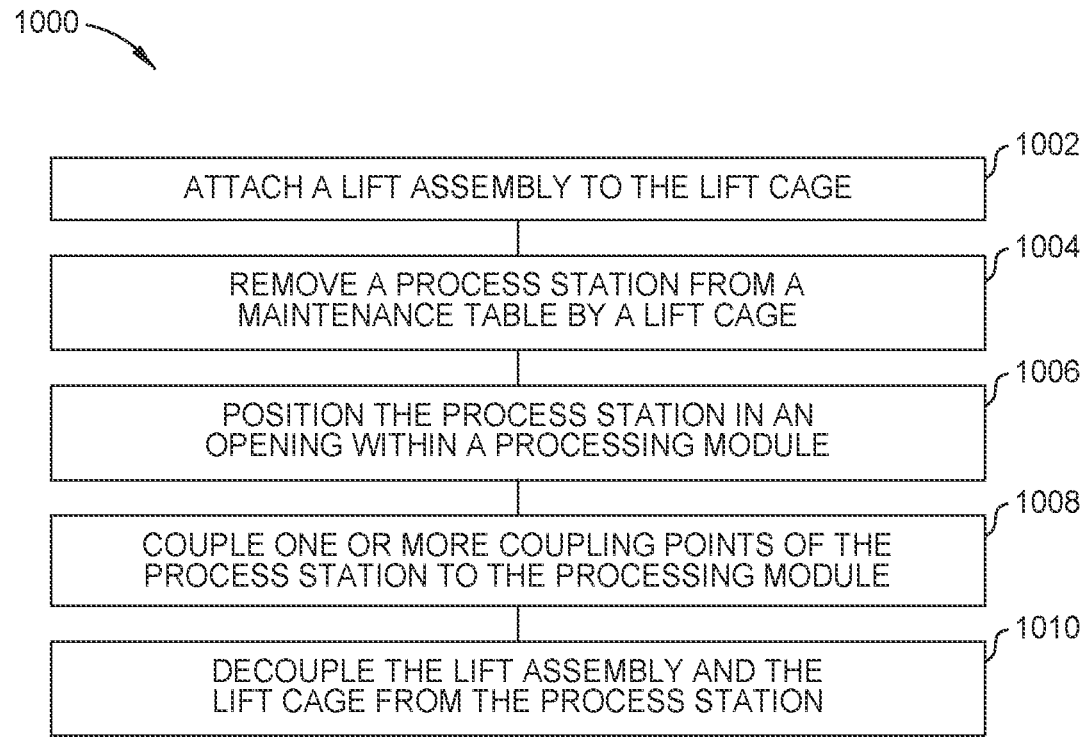
FIG. 10 is a method of placing a process station onto a processing module, according to one or more embodiments.

FIG. 10 is a method 1000 of placing a portion of a process station 160, which is separated from the processing module 150, onto the processing module 150. At the start of method 1000 the portion of the process station 160 may be disposed on the maintenance table 230. The method 1000 includes a first operation 1002 of attaching a lift assembly 250, to a lift cage 265. The lift cage 265 is connected to the portion of the process station by a lift ring, such as the lift ring 410. The lift cage 265 may already be connected to the portion of the process station before the first operation 1002, but in some embodiments, the lift cage 265 is connected to the portion of the process station during the first operation 1002 before attaching the lift assembly 250 to the lift cage 265. Attaching the lift assembly 250 to the lift cage 265 includes coupling a lift clasp 524 to the cage clasp 418. Coupling the two clasps enables the lift assembly to support the portion of the process station via the cage clasp 418. In some embodiments, attaching the lift assembly 250 to the lift cage 265 may involve connecting one or more connectors different from the lift clasp 524 and the cage clasp 418.

After the first operation 1002, the portion of the process station 160 is removed from a maintenance table 230, by the lift cage 265 during a second operation 1004. Removing the portion of the process station 160 from the maintenance table 230 includes vertical transfer of the portion of the process station 160 off the maintenance table 230 and back over a processing module 150.

After the second operation 1004, the process station 160 is positioned over or within an opening within the processing module 150 during a third operation 1006. The opening is disposed through an upper module surface 211 of the processing module 150. Positioning the portion of the process station 160 in the opening includes positioning the portion of the process station 160 over the opening and lowering the portion of the process station 160 until the cylindrical contact components 442 of the arms 414 of the lift cage 265 contacts one or more guide posts 260. The contact components 442 and the guide posts 260 guide the portion of the process station 160 along the guide posts 260 to a resting position on the processing module 150.

After the third operation 1006, a fourth operation 1008 is performed. The fourth operation 1008 includes coupling one or more coupling points, such as the coupling components 430, of the portion of the process station to the processing module. This coupling may include mechanically or hydraulically actuating the coupling points or simply inserting one or more coupling posts into one or more holes or grooves along the upper surface of the processing module. A docking unit 440 disposed on the process station 160 is coupled to a mating unit 805 disposed on the processing module 150 during the fourth operation 1008. Coupling the docking unit 440 and the mating unit 805 includes engaging the mating unit 805 and the docking unit 440. In some embodiments, at the completion of the third operation 1006, the source assembly 370 is positioned on and aligned with the lower portions of the processing station 160 and processing module 150. In most of the embodiments of the disclosure described herein, upon completion of the third operation 1006 all of the electrical, pneumatic and other fluid connections have been made in the processing station 160 due to the coupling the docking unit 440 to the mating unit 805.

After the fourth operation 1008, a fifth operation 1010 of decoupling the lift assembly and the lift cage from the process station is performed. Decoupling the lift assembly includes disengaging the lift clasp and the cage clasp. Subsequently or simultaneously, the lift cage is removed from the portion of the process station by decoupling the lift cage from the lift ring. In some embodiments, the lift cage may remain on the process station.

After removal of the lift cage, the lift cage may be coupled to another of the process stations and a portion of a second process station may be removed for maintenance as described with respect to the method 900 of FIG. 9.

Lift Assembly Mounting Example

Figure 11A:
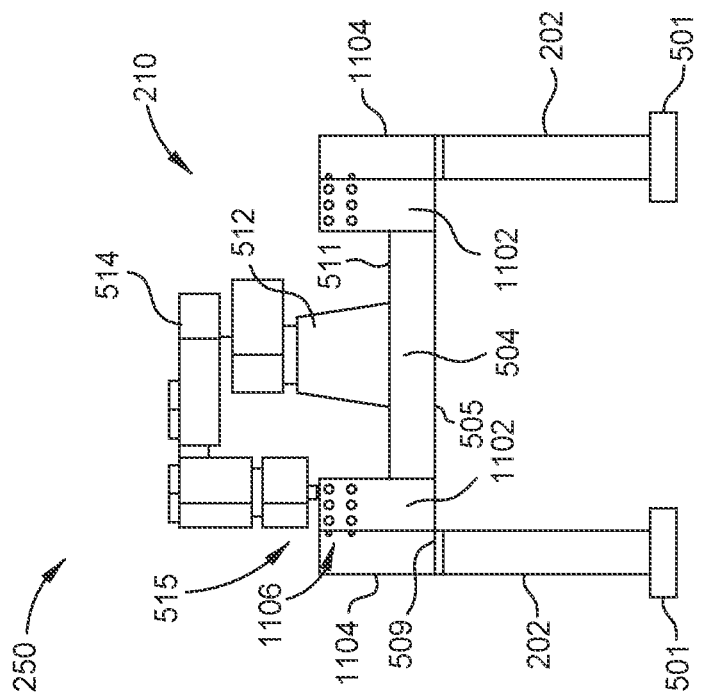
FIGS. 11A-11C are schematic side views of the lift assembly of FIG. 5 during placement of the lift assembly in a process station transfer position, according to one or more embodiments.
Figure 11B:
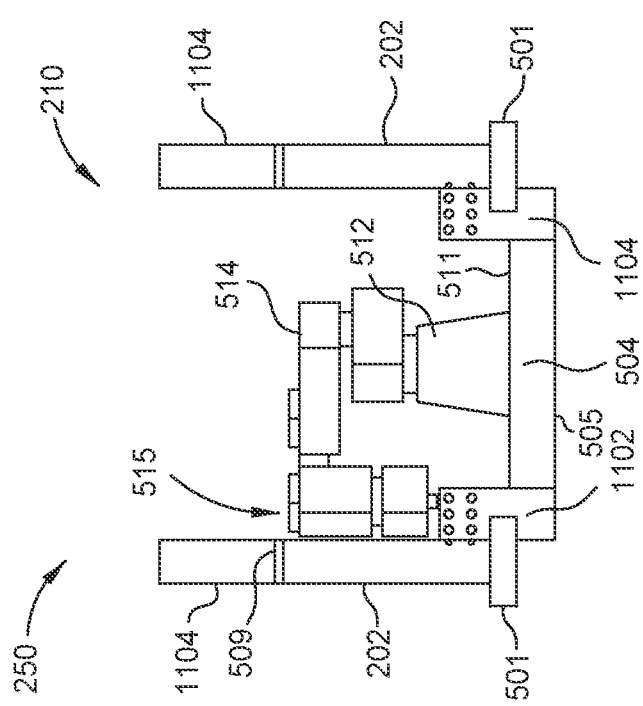
Figure 11D:
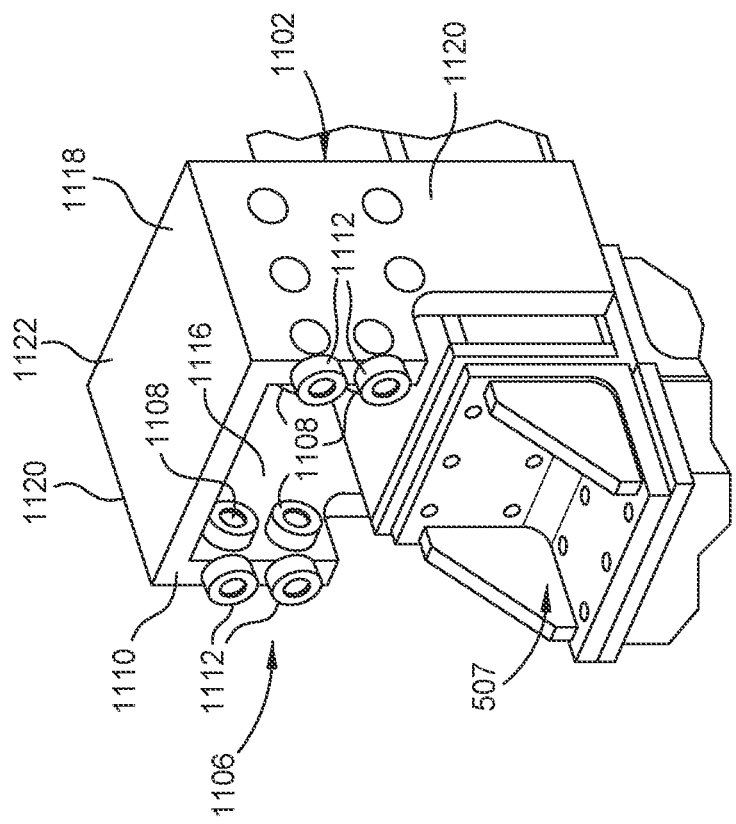
FIG. 11D is an isometric view of a roller bracket of FIGS. 11A-11C, according to one or more embodiments.
Figure 11C:
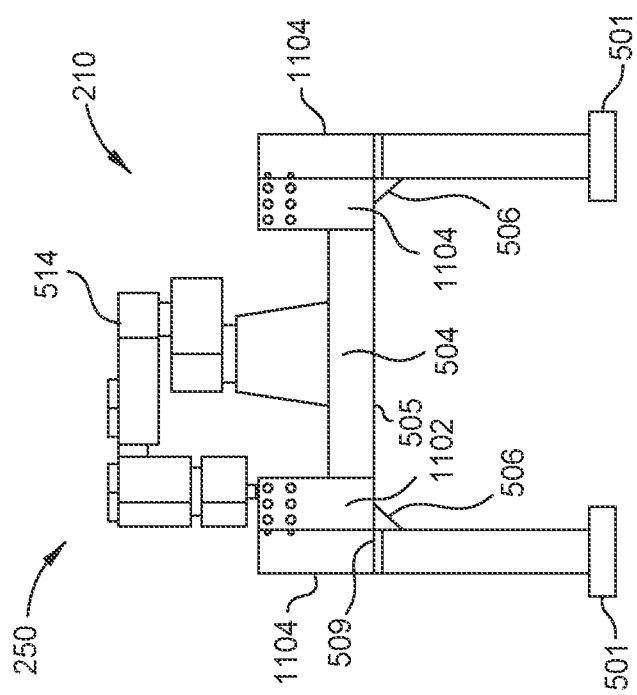

FIGS. 11A-11C are schematic side views of the lift assembly 250 of FIG. 5 during placement of the lift assembly 250 in a process station transfer position, according to one or more embodiments. Due to size constraints during shipping and packaging, the lift assembly 250 is often not able to be shipped in a raised and fully operational position. Therefore, the components of the lift assembly 250 are configured to allow the lift assembly 250 to be easily setup after shipping. The lift assembly 250 is shipped in a compressed position similar to that shown in FIG. 11A.

The compressed position includes the arm assembly 210 and the support bar 504 being lowered, such that the support bar 504 is disposed below the top surface 509 of the support legs 202. While in the compressed position, the support bar 504 is coupled to the support legs 202 by roller assemblies 1102 disposed on either side of the support bar 504 and contacting the support legs 202. The roller assemblies 1102 connect the support legs 202 and the support bar 504. Leg extensions 1104 are also coupled to the top surface 509 of the support legs 202. The leg extensions 1104 extend upward from the distal end of the support legs 202. FIG. 11A illustrates the leg extensions 1104 pre-attached to the support legs 202 after removing the lift assembly 250 from the packaging. In some embodiments, the leg extensions 1104 are separate from the support legs 202 in the packaging and are attached to the support legs 202 after removing the lift assembly 250 from the packaging.

Figure 12:
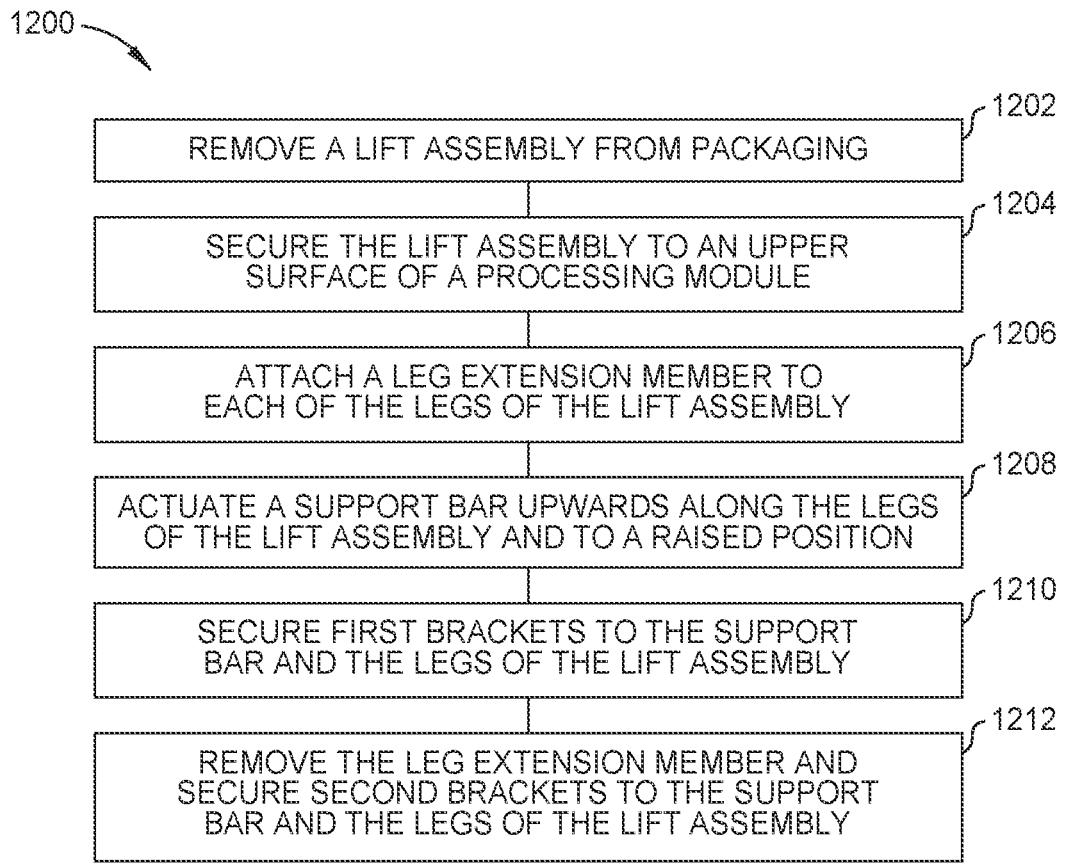
FIG. 12 is a method of placing the lift assembly in a process station transfer position, according to one or more embodiments.

The lift assembly 250 is assembled using a method 1200 as shown in FIG. 12. The method 1200 includes a first operation 1202 of removing the lift assembly 250 from packaging (not shown). The packaging is fabricated to secure the lift assembly 250 during transfer from a lift assembly 250 fabrication site to a customer site. After removal of the lift assembly 250 from the packaging, the lift assembly 250 may be in a compressed position as shown in FIG. 11A. The leg extensions 1104 are not yet attached to the support legs 202 during the first operation 1202.

After the first operation 1202, the lift assembly 250 is secured to an upper surface, such as the upper surface of the upper support element 201, of a processing module 150 during a second operation 1204. In alternative embodiments, the lift assembly 250 is pre-assembled with the processing module 150 and the second operation 1204 is not performed.

A third operation 1206 includes attaching the leg extensions 1104 to each of the support legs 202 of the lift assembly 250. Attaching the leg extensions is performed either before, during, or after the second operation 1204. During the third operation 1206, the leg extensions 1104 are attached to the top surface 509 of the support legs 202. The leg extensions 1104 are coupled at a top distal end of the support legs 202 furthest from the upper support element 201. As shown in FIG. 11A, the leg extensions 1104 include a similar cross-sectional shape as the upper portion of the support legs 202. In some embodiments, the leg extensions 1104 have a rectangular cross section.

After the leg extensions 1104 are attached to the support legs 202, the support bar 504 is actuated upwards along the support legs 202 of the lift assembly 250 and to a raised position during a fourth operation 1208. Actuating the support bar 504 upwards is performed by an actuator assembly (not shown). The actuator assembly may be a jack assembly, such as a hydraulic jack or a scissor jack. The actuator assembly may further include one or more linear actuators disposed within the support legs 202.

After actuating the support bar 504 and the arm assembly 210 upwards with the actuator, the lift assembly 250 is in a lifted position as shown in FIG. 11B. FIG. 11B illustrates that to reach a fully lifted position the roller assemblies 1102 are actuated from the support legs 202 onto the leg extensions 1104. The leg extensions 1104 provide an extended vertical distance in which the support bar 504 may be actuated, such that the bottom surface 505 of the support bar 504 may be brought even with or disposed above the top surface 509 of the support legs 202. The top surface 511 of the support bar 504 is disposed above the top surface 509 of the support legs 202 after actuating to the raised position of FIG. 11B.

After the fourth operation 1208, a fifth operation 1210 of securing the first brackets 506 to the support bar and the support legs 202 of the lift assembly 250 is performed. The lift assembly 250 after securing the first brackets 506 is shown in FIG. 11C. The leg extensions 1104 and the roller assemblies 1102 remain attached to the lift assembly 250 during the fifth operation 1210. Each of the first brackets 506 are coupled to the bottom surface 505 of the support bar 504 and the inner surface 503 of the support legs 202. The first brackets 506 are coupled to the bottom surface 505 of the support bar 504 and the inner surface 503 of the support legs 202 by one or more mechanical fasteners, such as bolts or screws. In some embodiments, the first brackets 506 are coupled using an adhesive. The first brackets 506 are angled brackets, and may be right angle brackets, such as an L-shaped bracket, or a triangular bracket, wherein one side of the bracket is contacting the support legs 202 and another side is contacting the support bar 504.

After the fifth operation 1210, a sixth operation 1212 of removing the leg extensions 1104 and securing the second brackets 507 to the support bar 504 and the support legs 202 of the lift assembly 250 is performed. The lift assembly 250 after the sixth operation 1212 is similar to the lift assembly 250 of FIG. 5, wherein each of the second brackets 507 connect the support bar 504 to one of the support legs 202. The second brackets 507 are connected to the outer surface 508 of the support bar 504 and the top surface 509 of the support legs 202 by one or more mechanical fasteners, such as bolts or screws. In some embodiments, the second brackets 507 are coupled using an adhesive. The second brackets 507 are angled brackets, and may be right angle brackets, such as an L-shaped bracket, or a triangular bracket, wherein one side of the bracket is contacting the support legs 202 and another side is contacting the support bar 504.

FIG. 11D is an isometric view of a roller assembly 1102 of FIGS. 11A-11C, according to one or more embodiments. Also shown in FIG. 11D is a more detailed view of one embodiment of the second bracket 507. The roller assembly 1102 includes a gripping assembly 1106 and a roller body 1118.

The gripping assembly 1106 includes a plurality of first rollers 1112. The plurality of first rollers 1112 are disposed to be coupled to either side of one of either a support leg 202 or the leg extensions 1104. The plurality of first rollers 1112 are configured to roll along the surface of the support leg 202 and/or the leg extension 1104 so that as the support bar 504 is raised, the first rollers 1112 stabilize the support bar 504. In some embodiments there are at least four first rollers 1112 to prevent rotation of the support bar 504. There may be a plurality of second rollers 1108 connected to the roller body 1118 and oriented in a normal direction from the plurality of first rollers 1112. The plurality of second rollers 1108 prevent the support bar 504 from moving from side to side along the length of the support bar 504 during installation. In some embodiments, there are at least four second rollers 1108, with two second rollers 1108 disposed opposite another set of two second rollers 1108. The second rollers 1108 are spaced to contact the inner surfaces of the support legs 202 and the leg extensions 1104.

The roller body 1118 includes two side members 1120 and one or more span guides 1122 disposed between and connecting the two side members 1120. In some embodiments, the one or more span guides 1122 includes a top surface of the roller body 1118. The roller body 1118 further includes an inner surface 1116 and a leg facing surface 1110. The leg facing surface 1110 is perpendicular to the inner surface 1116 and is the outermost surface of the roller body 1118 when the roller body 1118 is coupled to the support bar 504. Each of the first rollers 1112 are disposed on the leg facing surface 1110. Each of the second rollers 1108 are disposed on the inner surface 1116, such that the second rollers 1108 are disposed on the inside of the side members 1120. The inner surface 1116 may also be the surface of the roller body 1118, which contacts the support bar 504. The inner surface 1116 is connected to the support bar 504 by one or more fasteners (not shown) or an adhesive. In the embodiments described herein, the roller body 1118 is coupled to the support bar 504 by a mechanical fastener, such that the roller body 1118 may be removed from the support bar 504 when the support bar 504 is secured using the from first brackets 506 and the second brackets 507. This enables the roller assembly 1102 to be reused on multiple lift assemblies 250.

Substrate Processing Example

Figure 13:
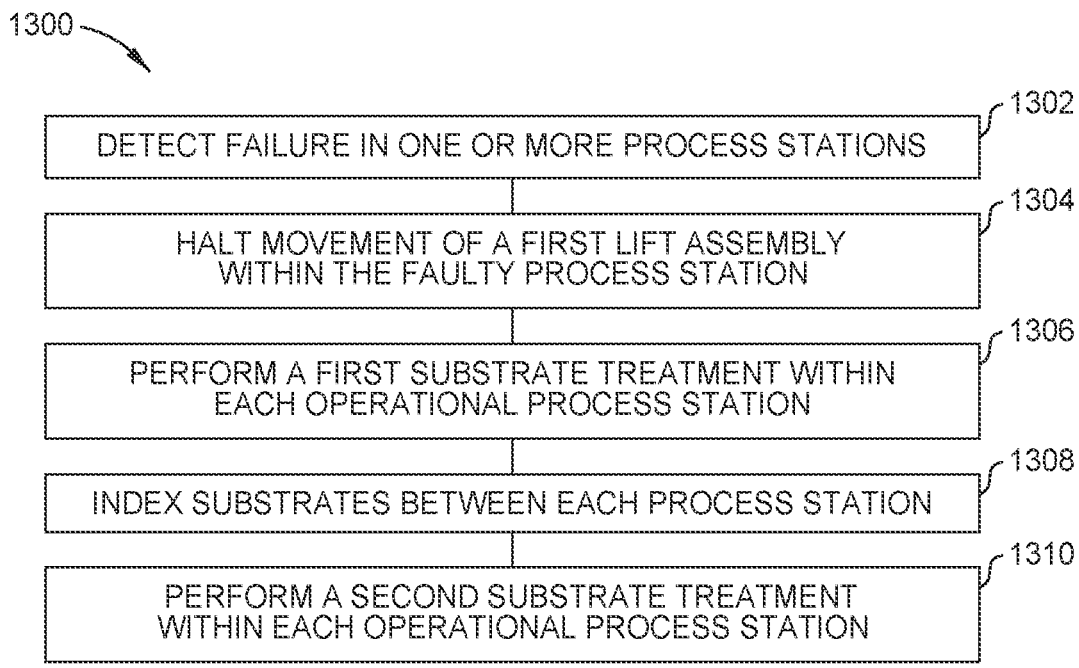
FIG. 13 is a method of processing one or more substrates when a fault is detected in a process station, according to one or more embodiments.

FIG. 13 is a method 1300 of processing one or more substrates when a fault is detected in a process station, such as one of the process stations 160A-160F. The method 1300 is performed to enable all of the substrates to be removed from the process stations before preventative maintenance begins on any one of the process stations. If the fault only impacts one of the process stations without causing contamination of the processing module, the substrates may be moved between the remaining process stations to complete processing of each of the substrates. It is generally desirable to complete the processing of as many, if not all of, the substrates within the processing module before removal of a process station, as removing a process station may allow atmosphere to leak into the rest of the transfer volume and contaminate substrates disposed on either robot arms or other process stations therein.

The process stations 160A-160F include upper portions of the assembly to form the processing region 360, such as the source assembly 370 and portions of the process kit assembly 380, such as one or more portions of a liner (FIG. 3A-3B).

During a first operation 1302 of the method 1300, a failure is detected in a portion of one or more process stations 160A-160F while disposed in the processing module 150. The failure may be any one of a fault in the magnetron assembly 371, the sputtering power supply 375, a process gas supply 389, an exhaust pump 365, one or more inlets, one or more outlets, a seal within the source assembly 370, or other faults.

After the first operation 1302, a second operation 1304 of positioning a first lift assembly, such as the support chuck assembly 392, below a first faulty process station 160 is performed. The first support chuck assembly 392 is halted in a lowered position, such that the first support chuck assembly 392, which is below the first process station 160 is similar to the configuration shown in FIG. 3A. Keeping the first support chuck assembly 392 in a lower position enables a robot or indexer, such as the transfer device 155, to travel freely around a transfer volume 145. The first support chuck assembly 392 may be held in place while all other support chuck assemblies 392 within the processing module 150 operate normally to lift and lower substrates between processes. As the fault is typically detected during substrate processing, the first support chuck assembly 392 may be held at the lower position with a substrate disposed thereon. Each of the process stations 160 which are not the first process station 160 or another faulty process station are described herein as operational process stations.

After the second operation 1304, a third operation 1306 of performing a first substrate treatment within each operation process station 160 is performed. The first substrate treatment may be the same or different for each substrate. In embodiments in which there are six total process stations 160A-160F and a single faulty process station within the processing module 150, two of the substrates have a first process performed thereon during the first substrate treatment and three of the substrates have a second process performed thereon during the first substrate treatment. The first process may deposit a first layer, while the second process deposits a second layer. In some embodiments, three or more different layers are formed within the process stations 160. After the third operation 1306, each of the substrates may be indexed between the process stations 160 to a different process station 160 during a fourth operation 1308, such that each substrate, which had the first process performed thereon, is transferred to a process station 160, which is configured to perform the second process. One or more of the substrates which had the second process performed thereon may be transferred out of the processing module altogether by a transfer robot (not shown). In some embodiments. After each of the substrates have been indexed and positioned on a different support chuck assembly 392, a fifth operation 1310 is performed in which a second substrate treatment is performed within each operational process station 160, which contains a substrate. Process stations 160, which no longer contain a substrate, may be left idle during the fifth operation 1310. The substrate, which was not processed during the third operation 1306 on the support chuck assembly 392 under the faulty process station 160, may be transferred and treated in an operation process station parallel to the fourth operation and the fifth operation. Depending upon when the failure was detected, the substrate, which was initially under the faulty process station 160, may utilize an additional process operation after the removal of each of the other substrates.

Figure 14:
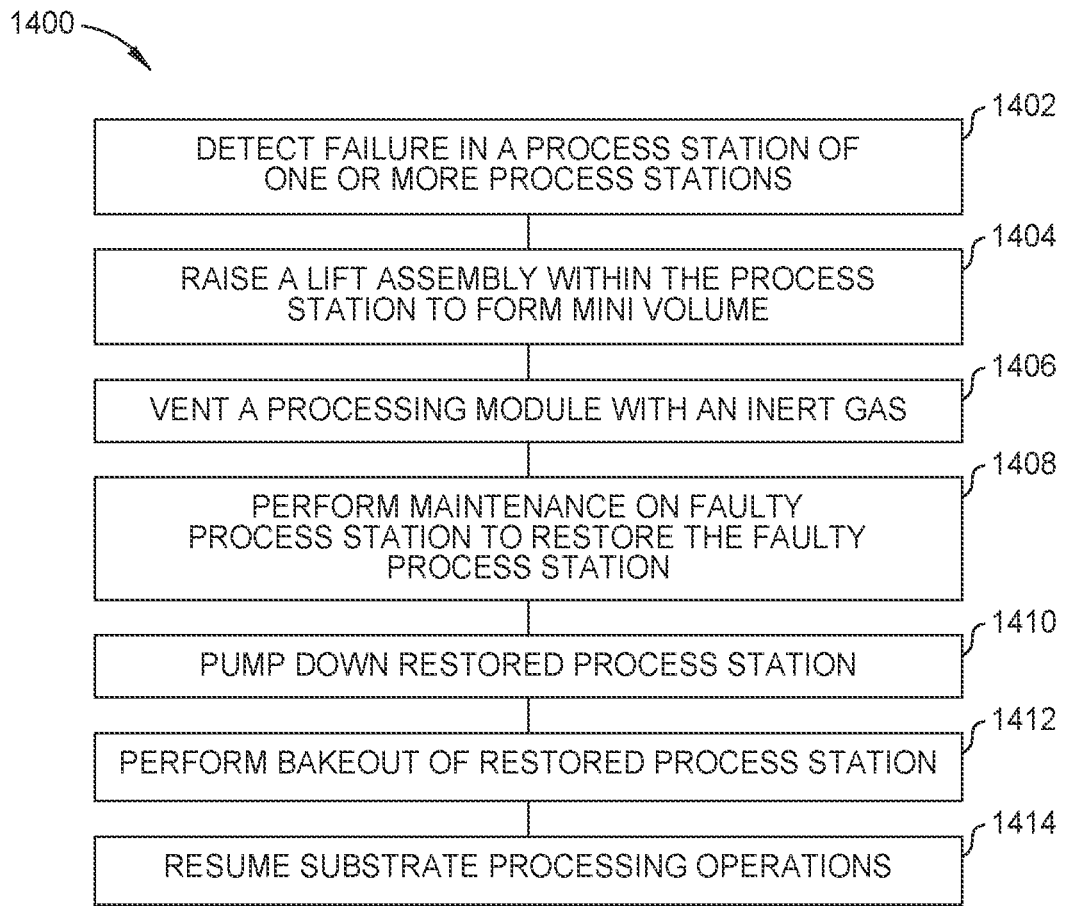
FIG. 14 is a method of recovering within a processing module after a fault is detected in a process station.

FIG. 14 is a method 1400 of recovering a processing module 150 after a fault is detected in a process station 160A-160F. After the detection of a fault in a process station 160, it is desirable to replace and repair the faulty process station in a quick and efficient matter. Previous embodiments of performing maintenance on the process station 160 involved venting the entire processing module 150 as described in the method 1500 of FIG. 15. The process station 160 and support chuck assembly 392 described herein enable for quick removal of the process station 160 and recovery of the processing module 150. The method 1400 only exposes the process station 160 which undergoes maintenance to atmosphere and does not expose the processing module 150. Exposing a smaller volume to atmosphere reduces the duration of the post maintenance routines on the processing module 150 before the processing module 150 is operating at normal capacity.

The method 1400 includes a first operation 1402 similar to the first operation 1302 of the method 1300 of FIG. 13. The first operation 1402 includes detecting a failure in a process station of one or more process stations 160. The failure of the first operation 1402 is similar to the failures within the method 1300 in that the failures do not involve gas leakage into or out of the processing region 360 and substrate processing can still be performed in other process stations 160A-160F, which are not impacted by the failure. In some embodiments, the entire method 1300 of FIG. 13 replaces the first operation 1402.

After the first operation 1402, a second operation 1404 is performed to raising a support chuck assembly 392 within the process station 160 to form a mini volume. The support chuck assembly 392 raised to the processing position may include only the support chuck assembly 392 underneath the faulty process station 160 or all of the process stations 160. Raising the support chuck assembly 392 underneath all of the process stations 160 to form the sealed process regions 360 may enable substrates to remain in the processing module 150 and/or reduce the total volume within the processing module 150. The process regions 360 can be filled with an inert gas during the first operation 1402. The process region 360 is as shown in FIG. 3B.

After the second operation 1404, the processing module 150 is vented and filled with an inert gas during a third operation 1406; such that the transfer volume 145 is filled with an inert gas along with any of the process stations 160 which remained open during the second operation 1404. During operation 1404 and subsequent operations, in some embodiments, the transfer volume 145 is filled with and pressurized to a higher pressure than atmospheric pressure with an inert gas. The inert gas fills the transfer volume 145, such that the pressure differential between the transfer volume 145 and the outside atmosphere is at least reduced to a nominal level. Reducing the pressure differential assists in reducing the pressure used to form the seal between the support chuck assembly 392 and a sealing assembly 385 of the faulty process station 160 during removal and maintenance of the portion of the faulty process station 160, while preventing atmosphere from entering the transfer volume 145. Preventing the atmosphere from entering the transfer volume 145 reduces the recovery time after the portion of the faulty process station 160 is replaced. The recovery time is reduced as shorter bake out and recovery process is needed when only the process station 160 which was replaced undergoes a bake out process. During venting of the transfer volume 145, the walls of the processing module 150 and/or the transfer device 155 is heated to prevent absorption or condensation of water onto the walls of the processing module 150 and/or the transfer device 155.

After the third operation 1406, a fourth operation 1408 of performing maintenance on a portion of the faulty process station 160 is completed. Performing maintenance on the portion of the process station 160 restores the process station 160 and involves the replacement or repair of one or more components within the process station 160. The fourth operation 1408 as described herein includes methods such as the method 900 and the method 1000 of FIGS. 9 and 10.

After the fourth operation 1408, the restored process station 160 is pumped down to a vacuum during a fifth operation 1410. In some embodiments, the pump down pressure is less than about $5 \times 10^{-5}$ Torr, such as less than about $5 \times 10^{-8}$ Torr. The transfer volume 155 of the processing module 150 may be either simultaneously or subsequently pumped down to a pressure similar to the pump down pressure of the process station.

After the fifth operation 1410, the restored process station 160 undergoes a bake out process during a sixth operation 1412. Bake out of the restored process station 160 includes heating of the process station 160 to a temperature of about 70° C. to about 170° C., such as about 80° C. to about 150° C. for about 90 minutes to about 150 minutes. The bake out time of the individual process station 160 without a bake out of the processing module 150 reduces the recovery time of the system. It is contemplated the reduction in bake out time as well as other recovery operations reduce the overall recovery time by over four hours. After the sixth operation 1412, substrate processing operations are resumed within each of the process stations 160A-160F during a seventh operation 1414.

Figure 15:
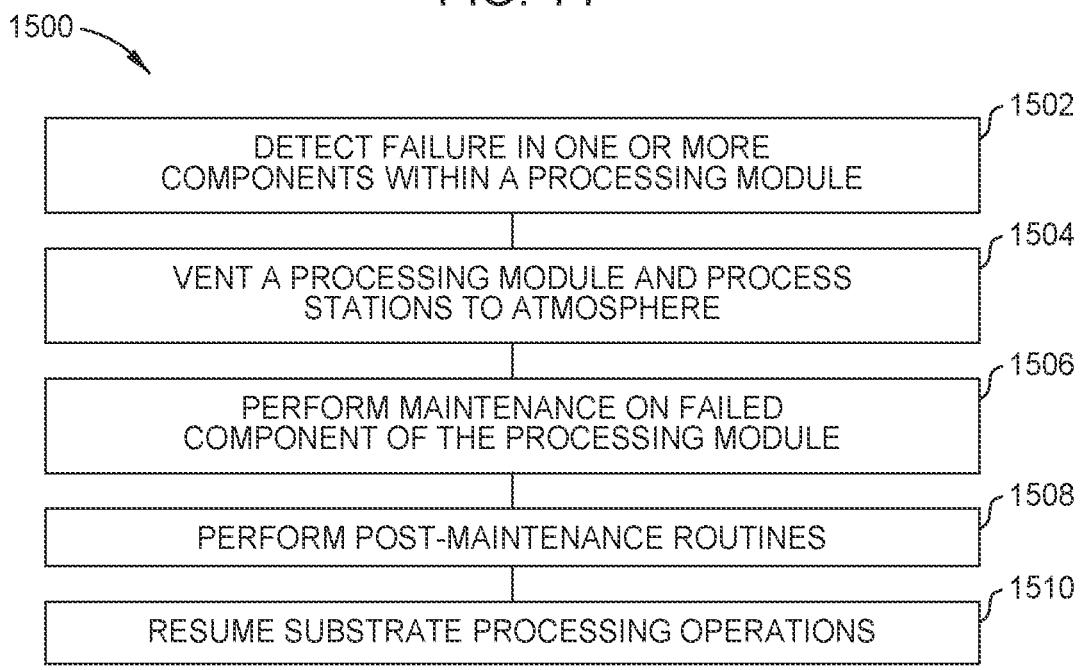
FIG. 15 is a method of recovering within a processing module after a fault is detected in the processing module.

FIG. 15 is a method 1500 of recovering within a processing module 150 after a fault is detected in the processing module 150. Detecting the fault or failure within the processing module 150 is performed during a first operation 1502. Faults within the processing module 150 are faults which may break a seal between an inner transfer volume, such as the transfer volume 145, and the outside atmosphere surrounding the processing module. The faults within the processing module 150 may additionally include a fault within one of the support chuck assemblies 392, a process chamber valve 144B, or a transfer device 155 (FIGS. 1-3B). As the fault is not within one of the process stations 160A-160F, the methods 1300, 1400 of FIGS. 13 and 14 are not applicable and the method 1500 of FIG. 15 is performed.

After detecting the failure during the first operation 1502, the processing module 150 and the process stations 160 are vented to atmospheric pressure during a second operation 1504. During the second operation, either atmosphere or an inert gas fills the transfer volume 145 within the processing module 150 and pressure between the outside atmosphere and the inside of the processing module 150 is equalized. After the second operation 1504, maintenance is performed on faulty or failed components of the processing module 150 during a third operation 1506. Maintenance may involve the repair or replacement of certain components. After maintenance is performed during the third operation 1506, a set of post-maintenance routines are performed on the processing module during a fourth operation 1508. The post-maintenance routines may include pumping down the processing module 150 and process stations 160, leak checking the processing module 150 and process stations 160, bake out of the processing module 150 and process stations 160, cooling of the processing module 150 and process stations 160, and wafer qualification. After the fourth operation 1508, substrate processing operations may be resumed during a fifth operation 1510.

Disclosed herein are apparatus and methods for placing process stations 160A-160F, within a processing module 150 and performing maintenance routines. The lift assembly 250 apparatus described for lifting the process stations 160A-160F enables faster and more efficient replacement/maintenance of process stations 160. Apparatus described herein simplify the process station 160 removal process and allow automation of multiple phases of process station 160 removal/replacement.

While the foregoing is directed to embodiments of the present disclosure, other and further embodiments of the disclosure may be devised without departing from the basic scope thereof, and the scope thereof is determined by the claims that follow.

What is claimed is:
1. A lift assembly comprising:
two or more support legs configured to be coupled to a processing module of a substrate processing system;
a support bar extending between the two or more support legs, wherein the support bar comprises opposing ends that are each coupled to one of the two or more support legs;
a first actuator coupled to the support bar and a first end of a first arm, wherein the first actuator has a first actuator rotational axis, and is configured to rotate the first arm about the first actuator rotational axis;
a second actuator coupled to a second end of the first arm and a first end of a second arm, wherein the second actuator has a second actuator rotational axis, and is configured to rotate the second arm about the second actuator rotational axis;
a lift actuator coupled to a second end of the second arm; and
a lift clasp coupled to the lift actuator, the lift actuator comprising a bellows assembly configured to expand and contract to raise the lift clasp.

2. The lift assembly of claim 1, wherein the first arm has a first arm length of greater than about 25 inches and the second arm has a second arm length of greater than about 25 inches.

3. The lift assembly of claim 2, wherein the first arm length is less than the second arm length.

4. The lift assembly of claim 1, wherein a distance from a bottom of the lift clasp to a bottom of the two or more support legs is a clasp height of about 10 inches to about 40 inches.

5. The lift assembly of claim 1, further comprising a plurality of first brackets disposed underneath the support bar, each of the first brackets coupling one of the support legs to the support bar.

6. The lift assembly of claim 5, further comprising a plurality of second brackets, each of the second brackets disposed on top of the support legs and coupling one of the support legs to the support bar.

7. The lift assembly of claim 1, wherein the first actuator rotational axis is parallel to the second actuator rotational axis and the lift actuator is configured to lift a process module along a lift axis parallel to the first actuator rotational axis.

8. The lift assembly of claim 1, wherein the bellows assembly couples the second arm to the lift clasp.

9. The lift assembly of claim 1, wherein the first actuator rotational axis is parallel to the second actuator rotational axis.

10. The lift assembly of claim 1, wherein the length of the support bar is less than the distance between a first inner surface of a first support leg of the two or more support legs and a second inner surface of a second support leg of the two or more support legs.

11. A substrate processing system comprising:
a processing module defining a transfer region;
a plurality of processing stations coupled to the processing module and disposed in an array around a central portion of the processing module;
a lift assembly disposed on the processing module and between the plurality of processing stations comprising:
two or more support legs coupled to the processing module;
a support bar extending between the two or more support legs, wherein the support bar comprises opposing ends that are each coupled to the two or more support legs;
a first actuator coupled to the support bar and a first end of a first arm, wherein the first actuator has a first actuator rotational axis, and is configured to rotate the first arm about the first actuator rotational axis;
a second actuator coupled to a second end of the first arm and a first end of a second arm, wherein the second actuator has a second actuator rotational axis, and is configured to rotate the second arm about the second actuator rotational axis;
a lift actuator coupled to a second end of the second arm; and
a lift clasp coupled to the lift actuator, the lift actuator comprising a bellows assembly configured to expand and contract to raise the lift clasp.

12. The substrate processing system of claim 11, further comprising:
a lift cage coupled to one or more of the processing stations, the lift cage comprising a cage clasp disposed above the processing station and two or more arms; and
a plurality of guide posts disposed on the processing module and around each of the processing stations.

13. The substrate processing system of claim 12, wherein the lift cage includes alignment guides extending therefrom and configured to guide the lift cage along the guide posts as one of the processing stations is raised or lowered.

14. The substrate processing system of claim 12, wherein each of the processing stations comprises a lift ring coupled thereto and configured to be coupled to the lift cage during transfer of the processing station.

15. The substrate processing system of claim 11, wherein the first actuator rotational axis is parallel to the second actuator rotational axis.

16. The substrate processing system of claim 11, wherein a distance from an upper surface of the processing module to the lift clasp is about 20 inches to about 40 inches.

17. The substrate processing system of claim 11, wherein each of the processing stations further comprises a source assembly and a docking unit coupled to a side of an outer source assembly casing of the source assembly, the docking unit comprising:
one or more water connections;
one or more gas connections; and
one or more electrical connections.

18. A lift assembly comprising:
two or more support legs configured to be coupled to a processing module of a substrate processing system;
a support bar extending between the two or more support legs, wherein the support bar comprises opposing ends that are each coupled to one of the two or more support legs;
a first actuator coupled to the support bar and a first end of a first arm, wherein the first actuator has a first actuator rotational axis, and is configured to rotate the first arm about the first actuator rotational axis;
a second actuator coupled to a second end of the first arm and a first end of a second arm, wherein the second actuator has a second actuator rotational axis, and is configured to rotate the second arm about the second actuator rotational axis;
a lift actuator coupled to a second end of the second arm;
a lift clasp coupled to the lift actuator; and
a plurality of first brackets disposed underneath the support bar, each of the first brackets coupling one of the support legs to the support bar.

19. The lift assembly of claim 18, further comprising a plurality of second brackets, each of the second brackets disposed on top of the support legs and coupling one of the support legs to the support bar.

20. The lift assembly of claim 18, wherein the lift actuator is configured to expand and contract to raise and lower the lift clasp.

* * * * *